(12) United States Patent
Kollgaard et al.

(10) Patent No.: US 12,326,569 B2
(45) Date of Patent: Jun. 10, 2025

(54) ADJUSTMENT MECHANISM

(71) Applicant: Apple Inc., Cupertino, CA (US)

(72) Inventors: Adam Y. Kollgaard, Santa Cruz, CA (US); Jonathan M. Anderson, San Francisco, CA (US); Jeffrey A. Griffis, San Carlos, CA (US); Joel Ebers, Seattle, WA (US); Trevor S. Chambers, San Diego, CA (US); Sung Kim, Palo Alto, CA (US); David Dostal, Hanover, NH (US); William Law, Palo Alto, CA (US)

(73) Assignee: APPLE INC., Cupertino, CA (US)

( * ) Notice: Subject to any disclaimer, the term of this patent is extended or adjusted under 35 U.S.C. 154(b) by 3 days.

(21) Appl. No.: 18/472,193

(22) Filed: Sep. 21, 2023

(65) Prior Publication Data

US 2024/0103288 A1 Mar. 28, 2024

Related U.S. Application Data

(60) Provisional application No. 63/376,761, filed on Sep. 22, 2022.

(51) Int. Cl.
*G02B 27/01* (2006.01)
*H05K 5/00* (2025.01)
*H05K 5/02* (2006.01)

(52) U.S. Cl.
CPC ....... *G02B 27/0176* (2013.01); *H05K 5/0017* (2013.01); *H05K 5/0204* (2013.01)

(58) Field of Classification Search
CPC ............ G02B 27/0176; H05K 5/0017; H05K 5/0204; A61F 9/027; A63B 33/0006; A63B 33/008
See application file for complete search history.

(56) References Cited

U.S. PATENT DOCUMENTS

| | | | |
|---|---|---|---|
| 5,486,841 A * | 1/1996 | Hara | H04N 13/398 345/9 |
| 6,677,919 B2 | 1/2004 | Saito | |
| 9,557,569 B2 * | 1/2017 | Tazbaz | G02B 27/0176 |
| 10,045,449 B1 * | 8/2018 | Yee | H05K 5/0086 |
| 10,228,727 B1 * | 3/2019 | Pickett | A45F 5/00 |
| 10,386,887 B2 * | 8/2019 | Chen | G06F 1/163 |
| 10,863,637 B1 * | 12/2020 | Pickett | H05K 5/0204 |
| 11,137,596 B2 | 10/2021 | Marić et al. | |
| 2009/0287282 A1 * | 11/2009 | Biser | A61F 7/02 607/109 |
| 2014/0347736 A1 | 11/2014 | Liu et al. | |
| 2017/0337737 A1 * | 11/2017 | Edwards | F16M 13/04 |
| 2018/0027676 A1 * | 1/2018 | Araki | G02B 27/0176 361/679.01 |

(Continued)

FOREIGN PATENT DOCUMENTS

WO 2017120353 A1 7/2017

OTHER PUBLICATIONS

Extended European Search Report for EP Application No. 23199121.7 dated Feb. 13, 2024.

*Primary Examiner* — Dorothy Harris
(74) *Attorney, Agent, or Firm* — Dorsey & Whitney LLP

(57) ABSTRACT

An apparatus can include a display, a facial interface, and a connection between the display and facial interface. The display can at least translate or rotate relative to the facial interface via the connection.

26 Claims, 22 Drawing Sheets

(56) References Cited

U.S. PATENT DOCUMENTS

| | | | |
|---|---|---|---|
| 2018/0055202 A1* | 3/2018 | Miller | G02B 27/0176 |
| 2018/0295733 A1* | 10/2018 | Wen | G02C 3/003 |
| 2019/0324280 A1* | 10/2019 | Yildiz | G02B 27/0176 |
| 2020/0341283 A1* | 10/2020 | McCracken | G02B 27/0176 |
| 2021/0381639 A1* | 12/2021 | Howard | F16M 13/04 |

* cited by examiner

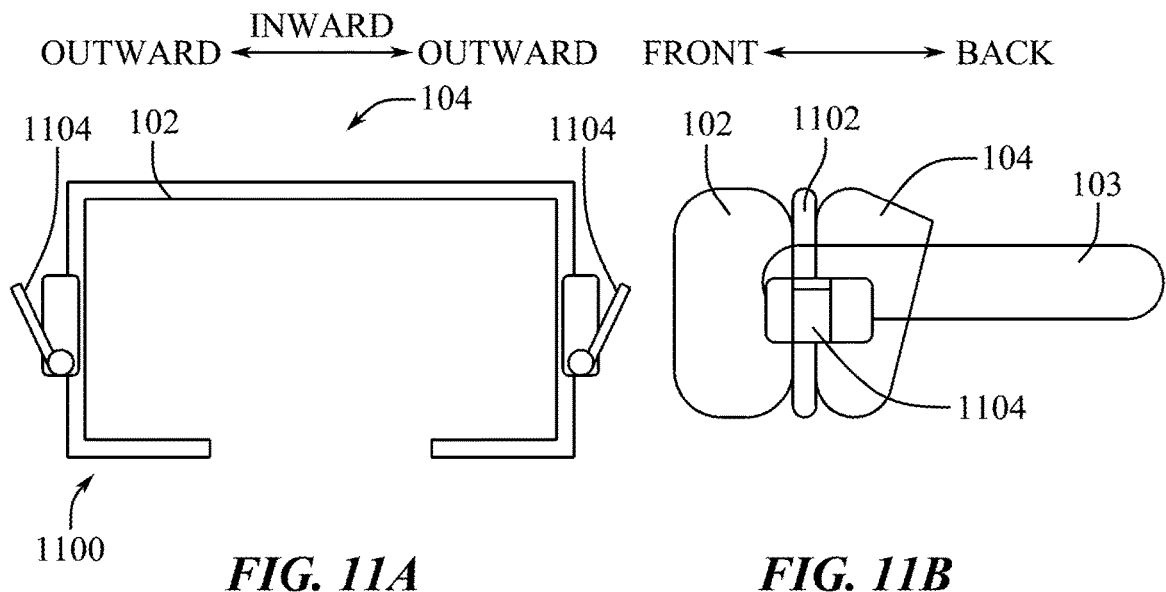
*FIG. 11A*  *FIG. 11B*
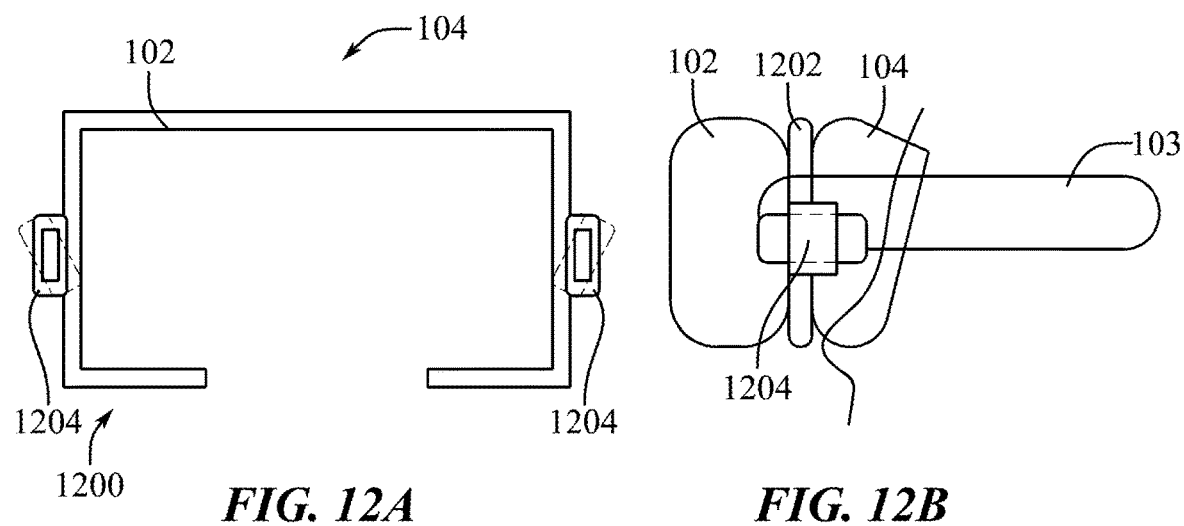
*FIG. 12A*  *FIG. 12B*

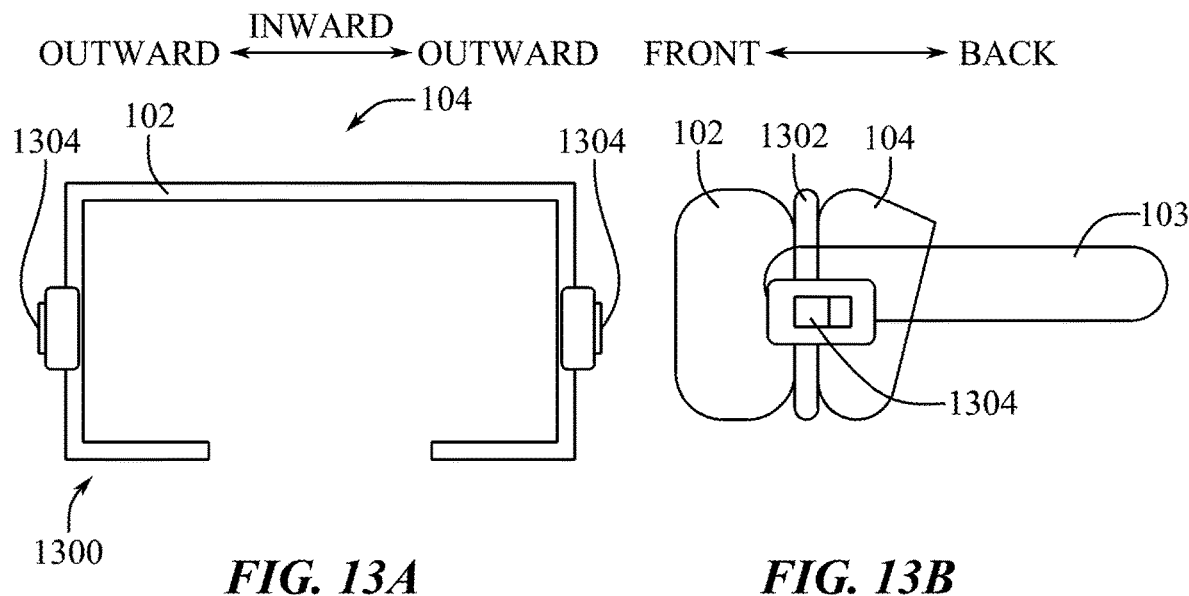
FIG. 13A  FIG. 13B
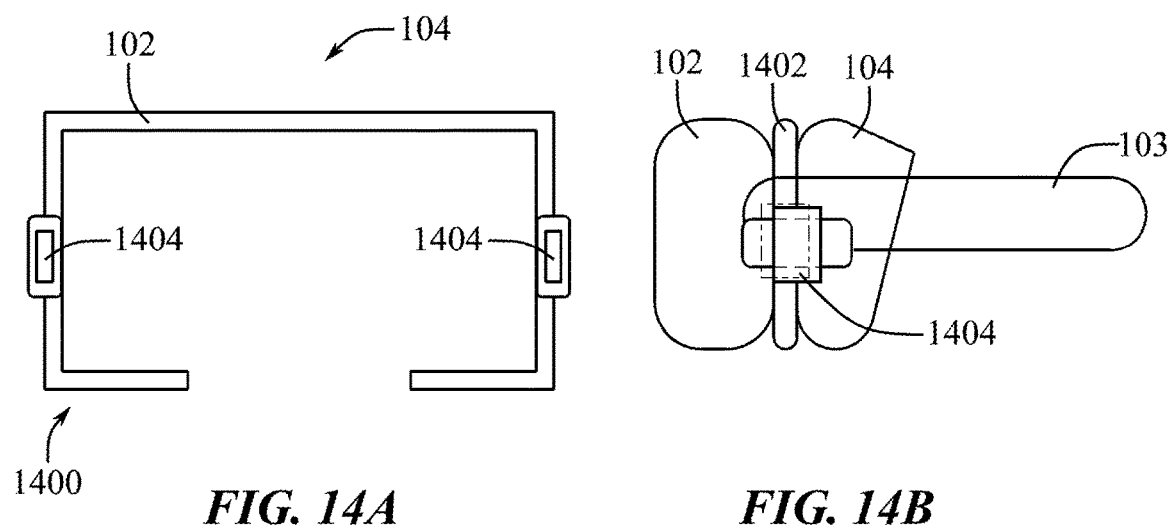
FIG. 14A  FIG. 14B

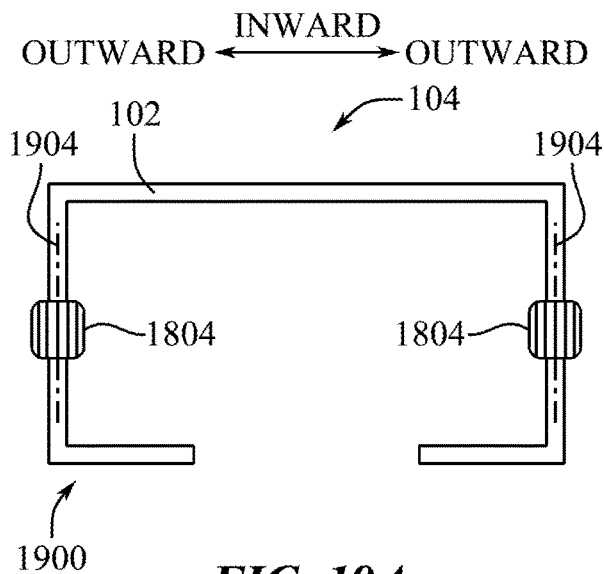
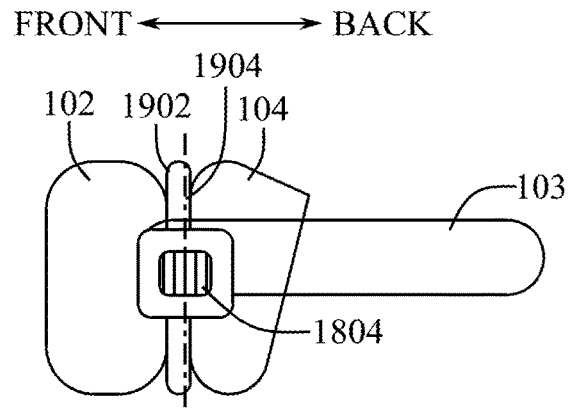
FIG. 19A  FIG. 19B
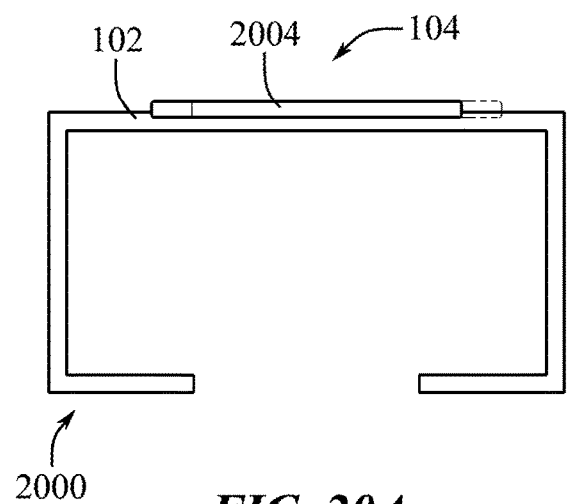
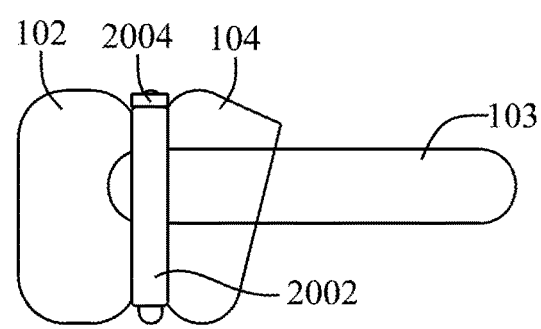
FIG. 20A  FIG. 20B

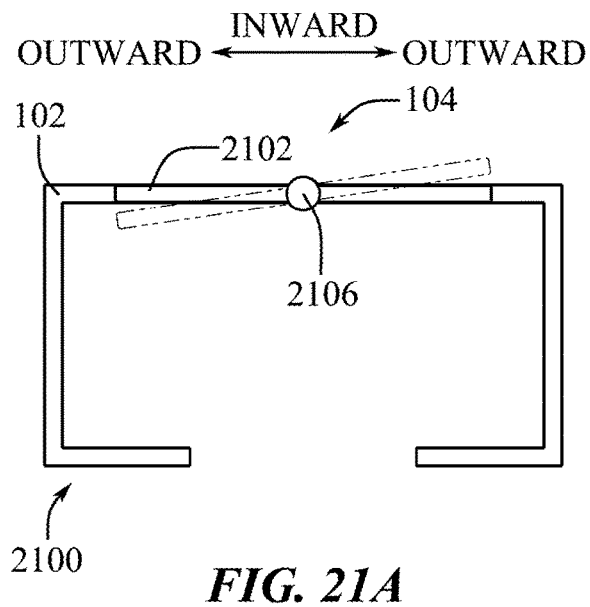
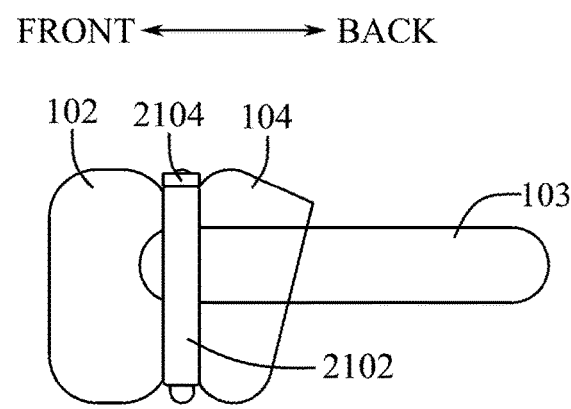
*FIG. 21A*        *FIG. 21B*
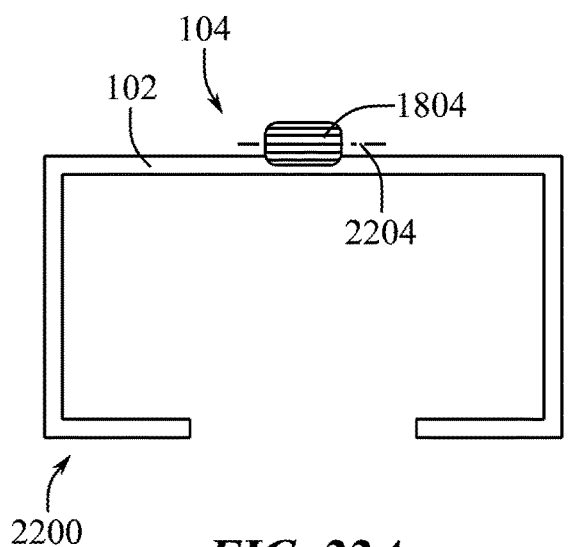
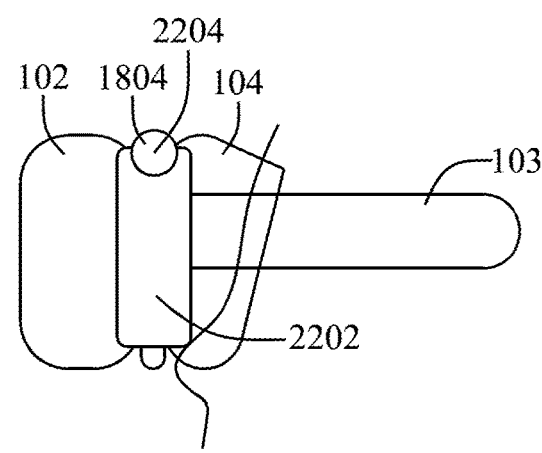
*FIG. 22A*        *FIG. 22B*

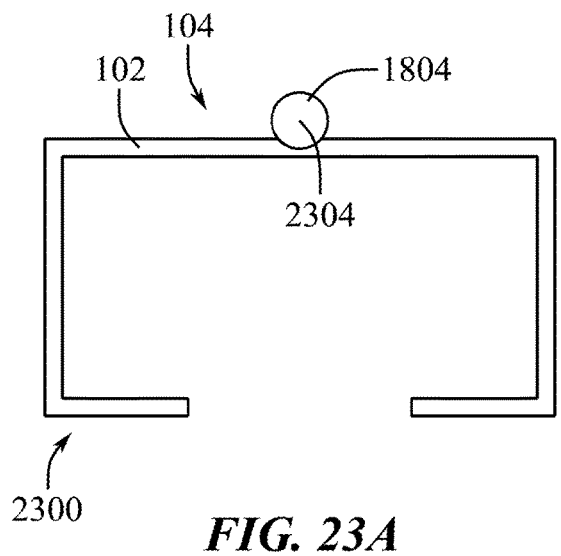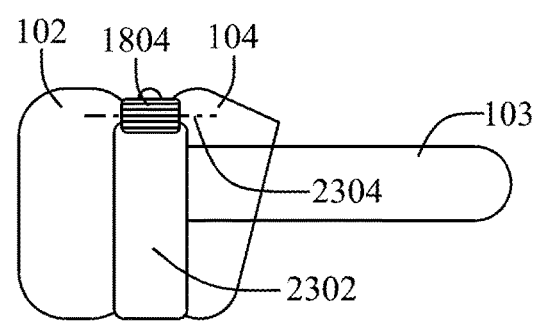
FIG. 23A　　　　　FIG. 23B
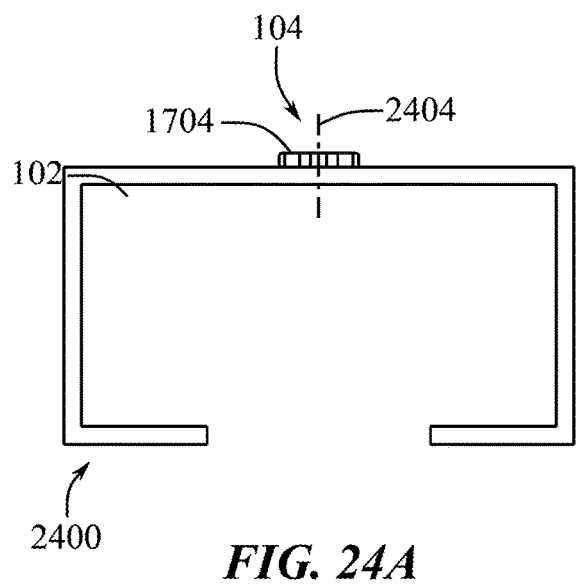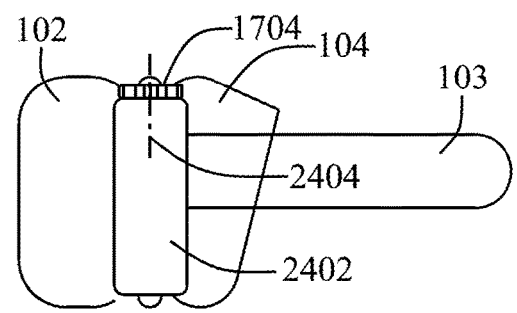
FIG. 24A　　　　　FIG. 24B
UP ↑ DOWN ↓　　　UP ↑ DOWN ↓

ADJUSTMENT MECHANISM

CROSS-REFERENCE TO RELATED APPLICATION(S)

This claims priority to U.S. Provisional Application No. 63/376,761, filed 22 Sep. 2022, and entitled "Adjustment Mechanism," the entire disclosure of which is hereby incorporated by reference.

FIELD

The described embodiments relate generally to adjustment mechanisms of a head-mountable device. More particularly, the present embodiments relate to adjustment mechanisms in a head-mountable device for altering tilt and eye relief of a head-mountable device.

BACKGROUND

Recent advances in portable computing have enabled head-mountable devices (HMD) that provide augmented and virtual reality (AR/VR) experiences to users. These HMDs have many components, such as a display, viewing frame, lens, batteries, and other components. Certain components of the HMD can also help create a unique user experience. HMDs typically include a display, where a user can view and interact with visualizations presented on the display screen of the HMD. Users of HMDs have myriad different head sizes, shapes, and contours of facial features which should be properly accommodated by the HMD for the user to have an optimum viewing experience.

In some instances, a user may desire to share the HMD with another user. Unfortunately, conventional HMDs are not typically customizable for certain users (e.g., with differently sized facial features or eyesight needs). Thus, these users may be unable to wear a conventional HMD or simply be uncomfortable doing so.

Indeed, user friendly adjustments in conventional HMDs are implemented in rudimentary ways (if any) that typically limit a user experience or ineffectively position the display screen on the user's face. For example, a user may have a facial feature that is different from the HMD design form factor, thereby positioning the HMD incorrectly on the user's head and creating an undesirable viewing experience. Therefore, devices and systems of a head-mountable device capable of intuitively positioning the head-mountable device relative to a user are desirable.

SUMMARY

In at least one example of the present disclosure, an apparatus includes a display, a facial interface, and a connection between the display and facial interface, the display being translatable or rotatable relative to the facial interface via the connection.

In one example, the connection includes a depth adjustment mechanism that, when adjusted, translates the display towards or away from the facial interface. In one example, the connection includes an angular adjustment mechanism that, when adjusted, rotates the display up or down relative to the facial interface. In one example, the connection includes an automated actuator or a manual actuator. In one example, the manual actuator is operable from a single interface location. In one example, the connection includes an adjustment resolution for transitioning between a first state and a second state. In one example, the adjustment resolution is non-continuous.

In at least one example of the present disclosure, a head-mountable device includes a display, a facial interface, a strap connected to at least the display (e.g., the display frame) or the facial interface, and an actuator moveably constraining the display relative to the facial interface.

In one example, the actuator includes an actuator control including a lever, a button, a dial, a rocker, a slider, or a toggle. In one example, the actuator control is positioned at a top portion or a side portion of the display or the facial interface. In one example, the actuator control is accessible when the apparatus is donned. In one example, the actuator actuates in response to voice commands or gestures. In one example, the actuator provides two degrees of freedom for the display relative to the facial interface. In one example, a first degree of freedom includes a linear translation, and a second degree of freedom include an angular tilt.

In at least one example of the present disclosure, a wearable electronic device includes a display, a facial interface, an angular adjustment connection between the display and the facial interface, and a linear adjustment connection between the display and the facial interface.

In one example, the angular adjustment connection includes a linkage that, when extended or retracted, pivots the display relative to the facial interface. In one example, the linear adjustment connection includes a member that, when actuated, increases or decreases a linear distance between the display and the facial interface. In one example, the angular adjustment connection or the linear adjustment connection is dynamically adjustable for multiple users. In one example, the angular adjustment connection and the linear adjustment connection include adjustable pillars. In one example, the adjustable pillars are positioned in a forehead region, a zygoma region, or maxilla region when the apparatus is donned.

Another aspect of the present disclosure relates to a wearable apparatus. The wearable apparatus can include a head-mountable display, a facial interface, and a connection movably constraining the head-mountable display relative to the facial interface in a first degree of freedom including linear translation and a second degree of freedom including angular tilt.

In one example, the connection includes a linear slide. In one example, the linear slide is back-drivable. In at least one example, the wearable apparatus further includes a lock engageable with the linear slide. In certain examples, the linear slide includes a first set of teeth and the lock includes a second set of teeth engageable with the first set of teeth. In one example, the first set of teeth and the second set of teeth include leading tips. In a particular example, when the first set of teeth and the second set of teeth are engaged, the leading tips of the second set of teeth protrude past the first set of teeth, and the leading tips of the first set of teeth protrude past the second set of teeth. Further, in one example, the wearable apparatus can include a control to engage and disengage the lock and the linear slide. In some examples, the control is positionable adjacent to a maxilla region of a human face when the wearable apparatus is donned. In a specific example, the control is connected to the lock via a flexible drive shaft.

Yet another aspect of the present disclosure relates to a head-mountable device. The head-mountable device can include a display frame, a display disposed within the display frame, a facial interface, an arm connected to the display frame, and a linear slide movably constraining the display relative to the facial interface, the linear slide including a lock.

In one or more examples, the lock is deflectable in a first direction. In one example, the lock is translatable in a second direction perpendicular to the first direction. In a specific example, the linear slide is translatable in a third direction perpendicular to the first direction and the second direction. In some examples, the arm is connected to the display frame via a pivot connection, and the display frame is rotatable about the pivot connection independent of the arm.

Yet another aspect of the present disclosure relates to a wearable electronic device. The wearable electronic device can include a display, a facial interface, an angular adjustment connection between the display and the facial interface, and a linear adjustment connection between the display and the facial interface. The linear adjustment connection can include a set of actuators, a set of actuator locks engageable with the set of actuators, and an actuator control to manipulate the set of actuator locks.

In one or more examples, the set of actuators includes a pair of side slides and a pair of top slides. In one example, the actuator control includes a button. In one or more examples, upon depressing the actuator control, the set of actuator locks are disengaged from the set of actuators and the set of actuators is adjustable to translate the facial interface toward or away from the display. In at least one example, upon releasing the actuator control, the set of actuator locks are engaged with the set of actuators, and the set of actuators is positionally locked in place to inhibit translation of the facial interface toward or away from the display.

BRIEF DESCRIPTION OF THE DRAWINGS

The disclosure will be readily understood by the following detailed description in conjunction with the accompanying drawings, wherein like reference numerals designate like structural elements, and in which:

FIGS. 9A-24B respectively show example head-mountable devices with an actuator control.

DETAILED DESCRIPTION

Figure 1:
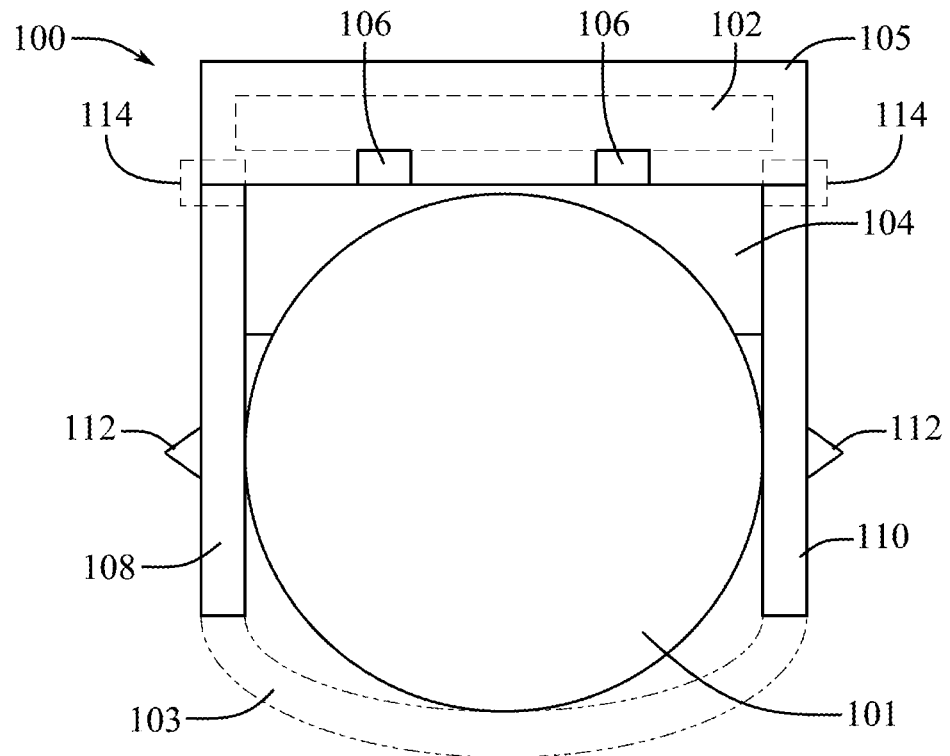
FIG. 1 shows a top view profile of a head-mountable device including a facial interface.

Detailed reference will now be made to representative embodiments illustrated in the accompanying drawings. The following descriptions are not intended to limit the embodiments to one preferred embodiment. Instead, the following descriptions are intended to cover alternatives, modifications, and equivalents as can be included within the spirit and scope of the described embodiments as defined by the appended claims.

The following disclosure relates to adjustment mechanisms of a head-mountable device (e.g., for AR/VR experiences). More particularly, the present embodiments relate to adjustment mechanisms of a head-mountable device for altering angle and/or distance of a head-mountable device relative to the user head (or eyes). These adjustment mechanisms include depth (e.g., translation) adjustments and/or angular (e.g., rotation) adjustments.

In one example, a head-mountable device includes a connection between a display and a facial interface. The connection allows the display to be translatable or rotatable relative to the facial interface. The translatable or rotatable movements allow the head-mountable device to achieve positions and combinations of positions that otherwise could not be achieved.

Conventional head-mountable devices do not include connections between the display and facial interfaces that allow translatable or rotatable movements. Therefore, conventional head-mountable devices do not allow the movement required to adjust depth for eye relief or angular adjustments to optimize viewing. Thus, conventional head-mountable devices cannot accommodate for different facial profiles, viewing preferences, eyesight capacities, etc.

By contrast, a head-mountable device of the present disclosure provides connections allowing translatable or rotatable motion relative to a facial interface. Such a head-mountable device has many advantages over a conventional head-mountable device. A head-mountable device with connections allowing movement of a display relative to the user's face allows a user adjust the depth and angle of the display screen as needed to accommodate their personal preferences or requirements. Additionally, a head mountable display with connections allows motion of the display relative to different users' faces, thereby improving a shareability of head-mountable device over conventional HMDs.

As disclosed herein, controlling the movement (e.g., linear translation or angular tilt) of a head-mounted display entails user friendly and simple actuation controls (e.g., lever, button, dial, rocker, slider, toggle, etc.) that are intuitive and easy to manipulate. Several examples of these devices are discussed below.

In one example, a head-mountable device includes a display, a strap connected to the display (e.g., the display frame), a facial interface, which is customizable to a user's facial profile, and a connection. The connection can be between the display and the facial interface such that the display is translatable and/or rotatable relative to the facial interface via the connection.

In another example, a head-mountable device includes a display, a strap connected to the display (e.g., the display frame), a facial interface, which is customizable to a user's facial profile, and an actuator. The actuator can moveably constrain the display relative to the facial interfaces.

In yet another example, a head-mountable device includes a display, a facial interface, which is customizable to a user's facial profile, and an angular and linear adjustment connection between the display and facial interface.

Accordingly, the apparatus and systems described herein provide angular and linear adjustments for a display of a head-mountable device in a user-friendly way, creating an enhanced more customizable user experience.

These and other embodiments are discussed below with reference to FIGS. 1-34. However, those skilled in the art will readily appreciate that the detailed description given herein with respect to these Figures is for explanatory purposes only and should not be construed as limiting. Furthermore, as used herein, a system, a method, an article, a component, a feature, or a sub-feature including at least one of a first option, a second option, or a third option should be understood as referring to a system, a method, an article, a component, a feature, or a sub-feature that can include one of each listed option (e.g., only one of the first option, only one of the second option, or only one of the third option), multiple of a single listed option (e.g., two or more of the first option), two options simultaneously (e.g., one of the first option and one of the second option), or combination thereof (e.g., two of the first option and one of the second option).

FIG. 1 illustrates a top view profile of a head-mountable device 100 worn on a user head 101. While the present systems and methods are described in the context of a head-mountable device 100, the systems and methods can be used with any wearable apparatus, or any apparatus or system that can be physically attached to a user's body, but are particularly relevant to an electronic device worn on a user's head. The head-mountable device 100 can include a display 102 (e.g., one or more optical lenses or display screens in front of the eyes of the user). The display 102 can include a display for presenting augmented reality visualizations, a virtual reality visualization, or other suitable visualization. The display 102 can also include a display frame 105 that houses optical components of the display 102. It will therefore be appreciated that when referencing the display 102 herein, the display frame 105 can be implemented as part of specific aspects or functionality for the display 102. For example, connection(s) 106 (described further below) can connect the facial interface 104 to at least one of the display 102 (e.g., optical elements of the display 102) or structural elements of the display 102 (e.g., the display frame 105).

The head-mountable device 100 also includes a facial interface 104 and a connection(s) 106 between the display 102 (e.g., the display frame 105) and the facial interface 104. As used herein, the term "facial interface" refers to a portion of the head-mountable device 100 that engages a user face via direct contact. In particular, a facial interface includes portions of the head-mountable device 100 that conform to (e.g., compress against) regions of a user face. To illustrate, a facial interface can include a pliant (or semi-pliant) face track that spans the forehead, wraps around the eyes, contacts the zygoma and maxilla regions of the face, and bridges the nose. In addition, a facial interface can include various components forming a structure, webbing, cover, fabric, or frame of a head-mountable device disposed between the display 102 and the user skin. In particular implementations, a facial interface can include a seal (e.g., a light seal, environment seal, dust seal, air seal, etc.). It will be appreciated that the term "seal" can include partial seals or inhibitors, in addition to complete seals (e.g., a partial light seal where some ambient light is blocked and a complete light seal where all ambient light is blocked when the head-mountable device is donned).

In addition, the term "connection" refers to a joining between the display 102 (e.g., via the display frame 105) and the facial interface 104. In some examples, a connection allows the display 102 to translate or rotate relative to the facial interface 104. In other examples, a connection allows the display 102 to both translate and rotate relative to the facial interface 104. For instance, the connection(s) 106, when adjusted, can slide (e.g., translate) the display 102 toward or away from the facial interface 104 (e.g., in a linear fashion). In another example, the connection(s) 106, when adjusted, can rotate the display 102 up or down relative to the facial interface 104 (e.g., in an angular fashion). Thus a connection can slidably join or rotatably join the display 102 and the facial interface 104.

In this manner, the connection(s) 106 can movably constrain the display 102 relative to the facial interface 104. As used herein, the term "movably constrain" or "movably constraining" refers to the type of connection that can dynamically move (e.g., translate or rotate), yet retain control over a particular element's movement or position. For example, to "movably constrain" means the connection(s) 106 can bound movement of the display 102 within two degrees of freedom (e.g., along a horizontal plane and along an additional plane non-planar with the horizontal plane) relative to the facial interface 104.

The connection(s) 106 can include one or more components (e.g., actuators, sliders, gears, levers, mechanical advantage devices, posts, mechanical stops, dampeners, etc.) that can allow (or actively provide) translation or rotation of the display 102 relative to the facial interface 104. The connection(s) 106 can have an adjustable resolution that is a continuous resolution or a non-continuous resolution, and capable of transitioning between states (e.g., between a first display position and a second display position). The connection(s) 106 can include a manual actuator control or an automated actuator control that is operable from a single interface location (or multiple interface locations).

In certain implementations, the connection(s) 106 are positioned between inner and outer surfaces of the head-mountable device 100. As used herein, an "outer surface" refers to an exterior surface of the head-mountable device 100 that outwardly faces the ambient environment. By contrast, as used herein, an "inner surface" refers to an exterior surface of the head-mountable device 100 that is oriented to face towards (or contact) a human face or skin.

Furthermore, the connection 106 can include a variety of different adjustment mechanisms, members, or movement mechanisms or movable connectors (e.g., bearings/bushings, dovetail slides, scissor mechanisms, sarrus linkages, gears, movable arms, etc.), cables (e.g., tensioned cables), actuators (e.g., mechanical, electromechanical, hydraulic, pneumatic, piezoelectric, etc.), and locking mechanisms (toggles, latches, ratchets, clamps, friction brakes, toothed brakes, hydraulic brakes, pneumatic bladders, non-backdrivable mechanisms, etc.), and other components. Locations of the connection 106 can be modified or tuned, as can the number of connections. For instance, the location and/or the number of the connection(s) 106 can correlate to an amount of force or pressure exerted on the user at any one datum (e.g., forehead region, maxilla region, zygoma region, etc.). In other instances, the location and/or the number of the connection(s) 106 can correspond to rigidity (or rigidity variances) between the connection(s) 106.

As used herein, the term "forehead region" refers to an area of a human face between the eyes and the scalp of a human. Additionally, the term "zygoma region" refers to an area of a human face corresponding to the zygomatic bone structure of a human. Similarly, the term "maxilla region" refers to an area of a human face corresponding to the maxilla bone structure of a human.

Additionally shown in FIG. 1, the head-mountable device 100 includes one or more arms 108, 110. The arms 108, 110 are connected to the display 102 and extend distally toward the rear of the head. The arms 108, 110 are configured to secure the display in a position relative to the user head 101 (e.g., such that the display 102 is maintained in front of a user's eyes). For example, the arms 108, 110 extend over the user's ears 112. In certain examples, the arms 108, 110 rest on the user's ears 112 to secure the head-mountable device 100 via friction between the arms 108, 110 and the user head 101. For example, the arms 108, 110 can apply opposing pressures to the sides of the user head 101 to secure the head-mountable device 100 to the user head 101. Optionally, the arms 108, 110 can be connected to each other via a strap 103 (shown in the dashed lines) that can compress the head-mountable device 100 against the user head 101. In particular examples, the strap 103 is connected to at least the frame of the display 102 or the facial interface 104.

In specific examples, the arms 108, 110 are connected to the display 102 (by way of the display frame 105) via a pivot joint 114. The pivot joint 114 can be external or internal with respect to the arms 108, 110 and/or the display frame 105. In these or other examples, the pivot joint 114 can allow the display frame 105 to rotate about the pivot joint 114 independent of the arms 108, 110. To do so, the pivot joint 114 can include a detent hinge, a friction hinge, a passive hinge, a full lock-out hinge, etc.

Any of the features, components, and/or parts, including the arrangements and configurations thereof shown in FIG. 1 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 1.

Figure 2A:
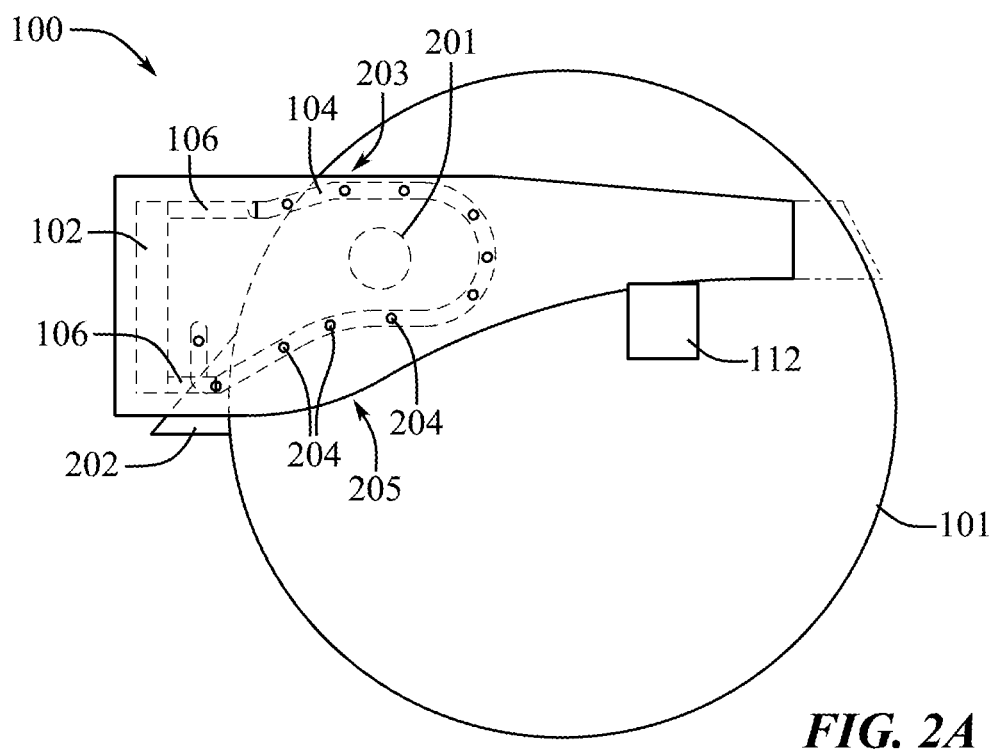
FIG. 2A shows a side view profile of a head-mountable device including a facial interface.
Figure 2B:
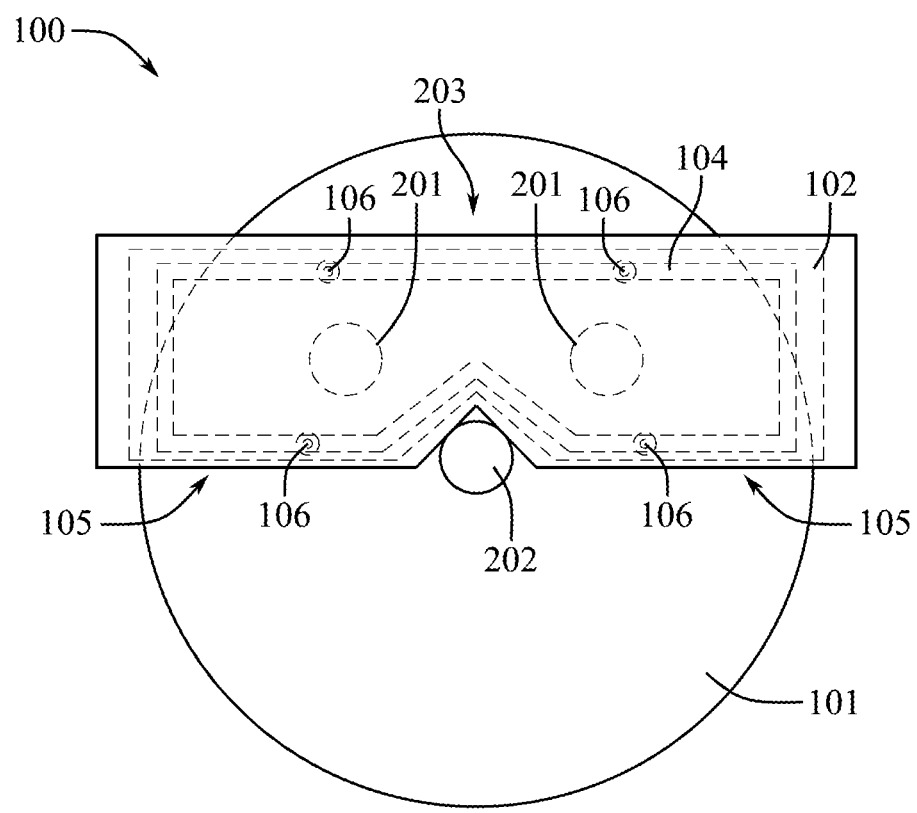
FIG. 2B shows a top view profile of a head-mountable device including a facial interface.

FIGS. 2A-2B respectively illustrate side and front view profiles of an example of the head-mountable device 100. As discussed above, the head-mountable device 100 includes the display 102, the facial interface 104, and the connection(s) 106. In particular, as shown in FIGS. 2A-2B, the facial interface 104 can indeed wrap around the eyes 201, bridge the nose 202, span the forehead 203, and contact the zygoma and maxilla regions 205 of the face.

Additionally shown in FIGS. 2A-2B, the head-mountable device 100 includes sensors 204 which can be attached to (or embedded within) the facial interface 104. As used herein, the tem "sensor" refers to one or more different sensing devices, such as a camera or imaging device, temperature device, oxygen device, movement device, brain activity device, sweat gland activity device, breathing activity device, muscle contraction device, etc. some particular examples of sensors include an electrooculography sensor, electrocardiography sensor, EKG sensor, heart rate variability sensor, blood volume pulse sensor, SpO2 sensor, compact pressure sensor, electromyography sensor, core-body temperature sensor, galvanic skin sensor, accelerometer, gyroscope, magnetometer, inclinometer, barometer, infrared sensor, global positioning system sensor, etc.

Further below, this disclosure describes with more particularity how the connection(s) 106 as adjustment mechanisms can be positioned within the head-mountable device 100. In addition, subsequent portions of this disclosure provide additional detail with respect to user interactions for controlling or actuating adjustment mechanisms.

Any of the features, components, and/or parts, including the arrangements and configurations thereof shown in FIGS. 2A-2B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 2A-2B.

The location and positioning of the connection(s) 106 can provide a stable yet flexible and adjustable interface between the facial interface 104 and the display 102. In accordance with one or more examples of the present disclosure, FIGS. 3A-3D illustrate a plurality of positions where the connection(s) 106 can be located between the display 102 and the facial interface 104. Although FIGS. 3A-3D illustrate particular locations, it will be appreciated that the locations of the connection(s) 106 can be modified within the scope of the present disclosure.

Figure 3A:
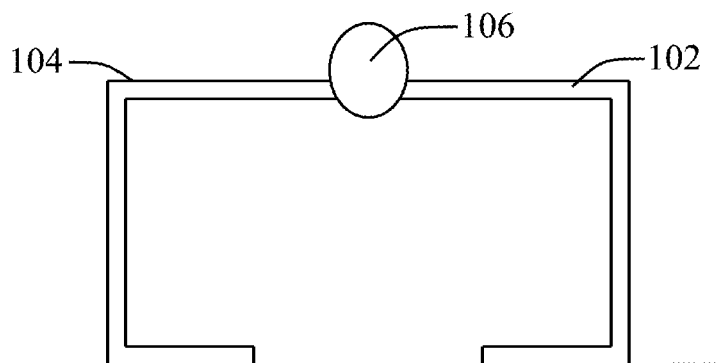
FIGS. 3A-3D show exemplary locations of adjustment mechanism of a head-mountable device.

In one example, FIG. 3A, shows the connection(s) 106 includes a single adjustment mechanism located at the forehead 203 of a user. The connection(s) 106 can be configured to provide a linear or angular connection between the display 102 and the facial interface 104. In particular implementations, the connection(s) 106 provides only angular (tilt) adjustment by pivoting the display 102 relative to the facial interface 104.

In at least some instances, a single-point system as shown in FIG. 3A can provide the simplest and most direct means of adjustment. For example, the connection(s) 106 in FIG. 3A can avoid potential angular misalignment or racking issues of multi-point systems. As another example, the connection(s) 106 in FIG. 3A can facilitate single-handed user adjustment of the head-mountable device 100.

Figure 3B:
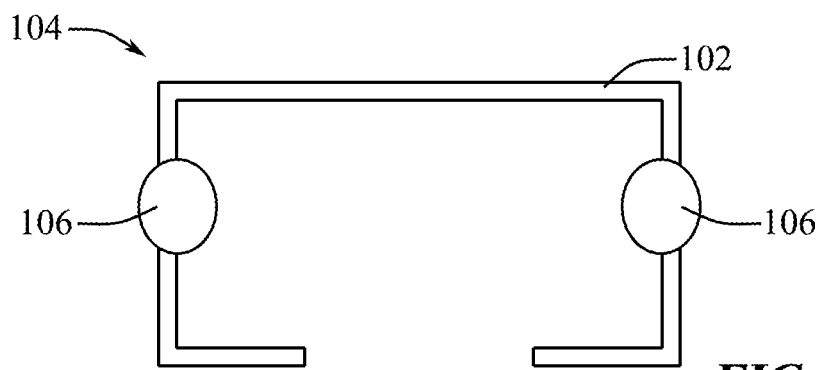

FIG. 3B shows another example where the connection(s) 106 include two adjustment mechanisms oppositely positioned between the facial interface 104 and the display 102. Specifically, the connection(s) 106 in FIG. 3B include a first adjustment mechanism on a left side and a second adjustment mechanism on a right side (e.g., near regions of the user eye). Similarly, in another example, the connection(s) 106 may be located near the zygoma or maxilla regions 205 of the face. The two connections can provide at least two points of angular or linear adjustment of the display 102 relative to the facial interface 104. For example, both of the connection(s) 106 in FIG. 3B can be adjusted linearly together to provide a depth adjustment, or adjusted angularly together to provide a vertical (up/down) tilt adjustment. In another example, one of the connections 106 can be extended outward and the other of the connection(s) 106 can be pushed inward (so as to provide a side-to-side or horizontal tilt adjustment).

Figure 3C:
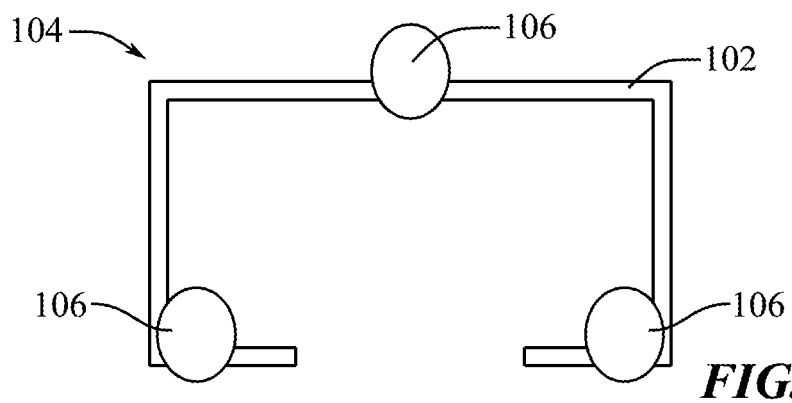
Figure 3D:
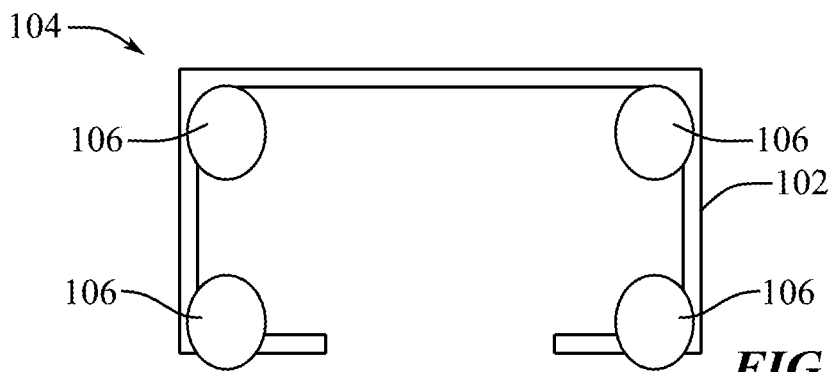

FIG. 3C shows the connection(s) 106 include three adjustment mechanisms—one near the forehead 203 and two at bottom corner areas at the zygoma or maxilla regions. Additionally, FIG. 3D shows the connection(s) 106 include four connection(s) 106—two at the top corners and two at the bottom corners. In at least some examples, multi-point systems like those shown in FIGS. 3B-3D can provide improved load distribution and/or rigidity. Multi-point systems like those shown in FIGS. 3B-3D can also satisfy larger load requirements, such as increased loads during a sudden impact event to the head-mountable device 100. In the case of multi-point systems, synchronization mechanisms can be added to ensure that each of the connection(s) 106 move in lockstep.

Any of the features, components, and/or parts, including the arrangements and configurations thereof shown in FIGS. 3A-3D can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 3A-3D. Moreover, although not shown, it will be appreciated that more than four of the connection(s) 106 are also contemplated, and the locations of any one the connection(s) 106 described can vary in position and location relative to the figures in which they were described.

Figure 4A:
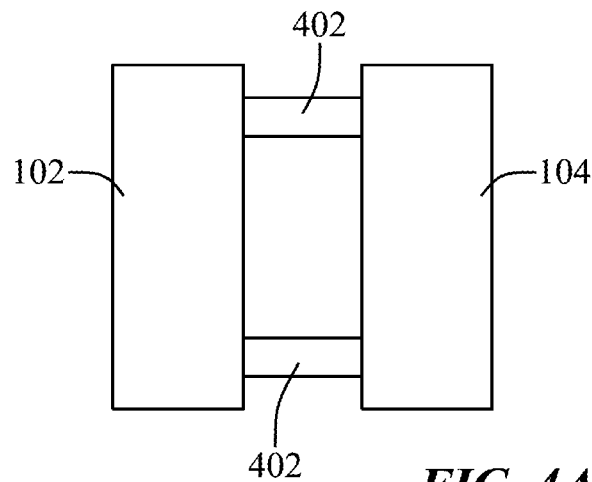
FIGS. 4A-4C show exemplary translatable positions of an adjustment mechanism.
Figure 4B:
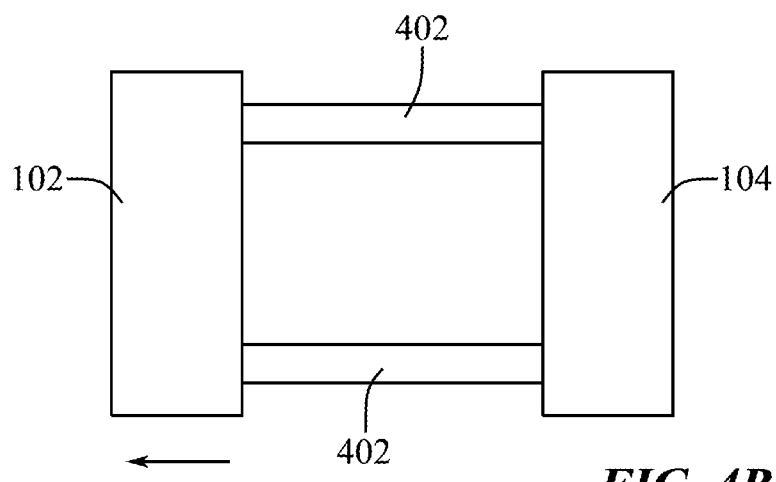
Figure 4C:
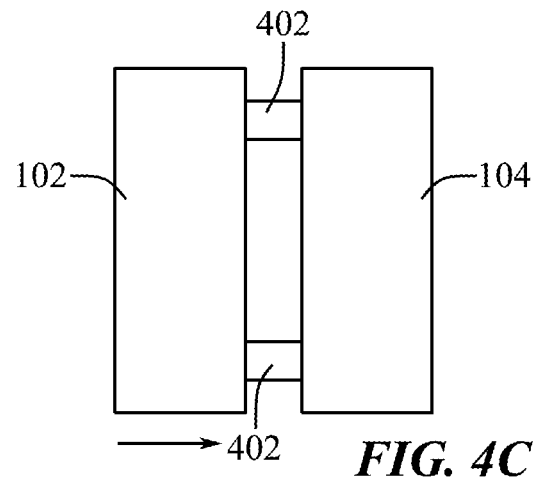

As mentioned above, the connection(s) 106 can include adjustment mechanisms that allow (or provide) movement of the display 102 relative to the facial interface 104. This movement can include motion in a single degree of freedom or multiple degrees of freedom. In accordance with one or more such examples, FIGS. 4A-4C illustrate an example of depth adjustment via depth adjustment mechanisms 402 (e.g., linear adjustment connections). For example, FIG. 4A shows the display 102 positioned relative to the facial interface 104 in a home state. In the home state, depth adjustment mechanisms 402 can be positioned at a default position, a customized position, etc. in which the display 102 is a predetermined distance (i.e., eye relief distance) away from the facial interface 104. In other instances, the home state can include a current positioning of the display 102 relative to the display 102.

FIG. 4B shows the depth adjustment mechanisms 402 in an extended state. In the extended state, the depth adjustment mechanisms 402 are extended or otherwise altered from the home state (or another state) to increase a relative distance between the display 102 and the facial interface 104.

FIG. 4C shows the depth adjustment mechanisms 402 in a retracted state. In the retracted state, the depth adjustment mechanisms 402 are retracted or otherwise altered from the home state (or another state) to decrease a relative distance between the display 102 and the facial interface 104.

In some examples, the various states shown in FIGS. 4A-4C can include discrete or predefined positions of the display 102 relative to the facial interface 104—where the predefined positions are differentiated by set (or customizable) step-sizes. For instance, the depth adjustment mechanisms 402 can be utilized to vary the position of the display 102 relative to the facial interface 104 in positional steps from 0 mm eye relief distance in a fully retracted state, to 6 mm eye relief distance in a fully extended state. In other examples, however, the various states shown in FIGS. 4A-4C can include non-discrete positions of the display 102 relative to the facial interface 104—where the positions are configurable via continuous adjustment of the depth adjustment mechanisms 402, due to a continuous interface that is gradually adjusting over a substantially smooth surface, providing a continuous adjustment resolution.

Adjustment of the depth adjustment mechanisms 402 can be performed in different ways. In some examples, user interactions to the depth adjustment mechanisms 402 (e.g., via one or more user controls) can actuate or move the depth adjustment mechanisms 402. Additionally or alternatively, the depth adjustment mechanisms 402 can actuate in response to one or more sensors of the head-mountable device 100 detecting a voice command or gesture (e.g., eye gesture, hand gesture, touch, etc.). Still further, in some examples, the head-mountable device 100 can automatically adjust the depth adjustment mechanisms 402 (e.g., based on one or more sensors of the head-mountable device 100 detecting a user field of view indicating adjustment is needed). Thus, in certain implementations, the head-mountable device 100 includes a motor to auto-drive certain actuation. In this example, the motor can mechanically interface with the connections or adjustment mechanisms to automate or controllably drive the adjustment mechanisms.

Any of the features, components, and/or parts, including the arrangements and configurations thereof shown in FIGS. 4A-4C can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 4A-4C. Moreover, although not shown, it will be appreciated that more than four of the connection(s) 106 are also contemplated, and the locations of any one the connection(s) 106 described can vary in position and location relative to the figures in which they were described.

Figure 5A:
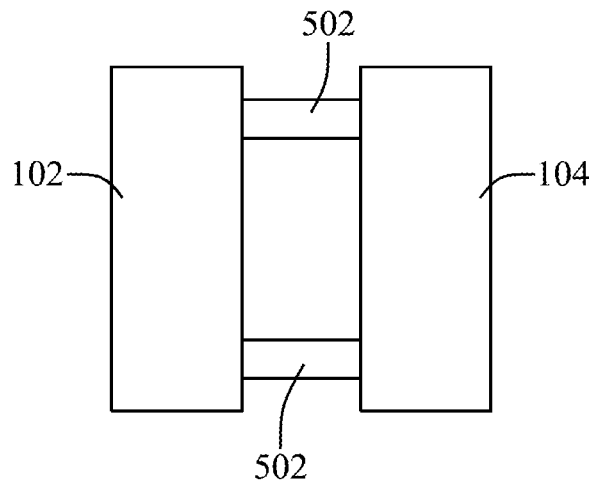
FIGS. 5A-5C show exemplary rotatable positions of an adjustment mechanism of a head-mountable device.
Figure 5B:
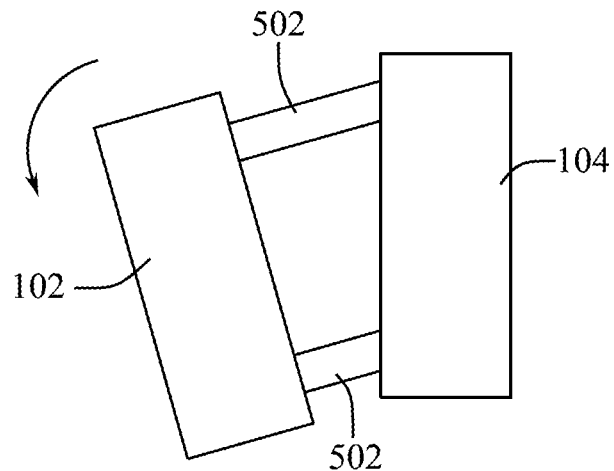
Figure 5C:
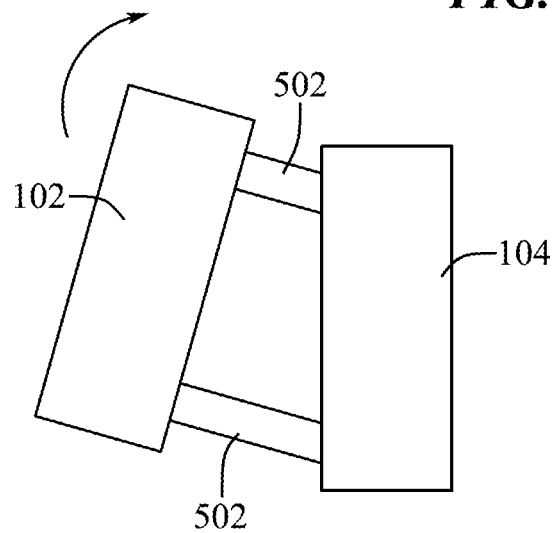

The connection(s) 106 can also allow (or provide) angular or rotational adjustment of the display 102 relative to the facial interface 104. In accordance with one or more such examples, FIGS. 5A-5C illustrate an example of tilt adjustment via angular adjustment mechanisms 502 (e.g., angular adjustment connections). Via adjustment of the angular adjustment mechanisms 502, the display 102 can pivot (e.g., rotate) the display 102 up or down by an angular displacement relative to the facial interface 104, as illustrated in FIGS. 5A-C.

In particular, FIG. 5A shows the angular adjustment mechanisms 502 in a home state (e.g., with no angular tilt). It will be appreciated, however, that alternative home states with angular tilt are herein contemplated.

FIG. 5B shows the angular adjustment mechanisms 502 in a negative angular state (e.g., downward angular tilt) relative to the home state. By contrast, FIG. 5C shows the angular adjustment mechanisms 502 in a positive angular state (e.g., upward angular tilt) relative to the home state.

As with the depth adjustment mechanisms 402 described above, the angular adjustment mechanisms 502 can also be adjusted in myriad different ways. For example, the angular adjustment mechanisms 502 can be adjusted manually (e.g., via user controls, voice commands, or user gestures). As another example, the head-mountable device 100 can automatically adjust the angular adjustment mechanisms 502 based on a detected user field of view.

In certain implementations, the angular state can have angular range of negative 7.5 degrees in a fully extended negative angular tilt state, to positive 7.5 degrees in a fully extended positive angular tilt state. The angular state can be discrete (e.g., with limited positional states) or continuous (e.g., unlimited positional states).

Any of the features, components, and/or parts, including the arrangements and configurations thereof shown in FIGS. 5A-5C can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 5A-5C.

Figure 6A:
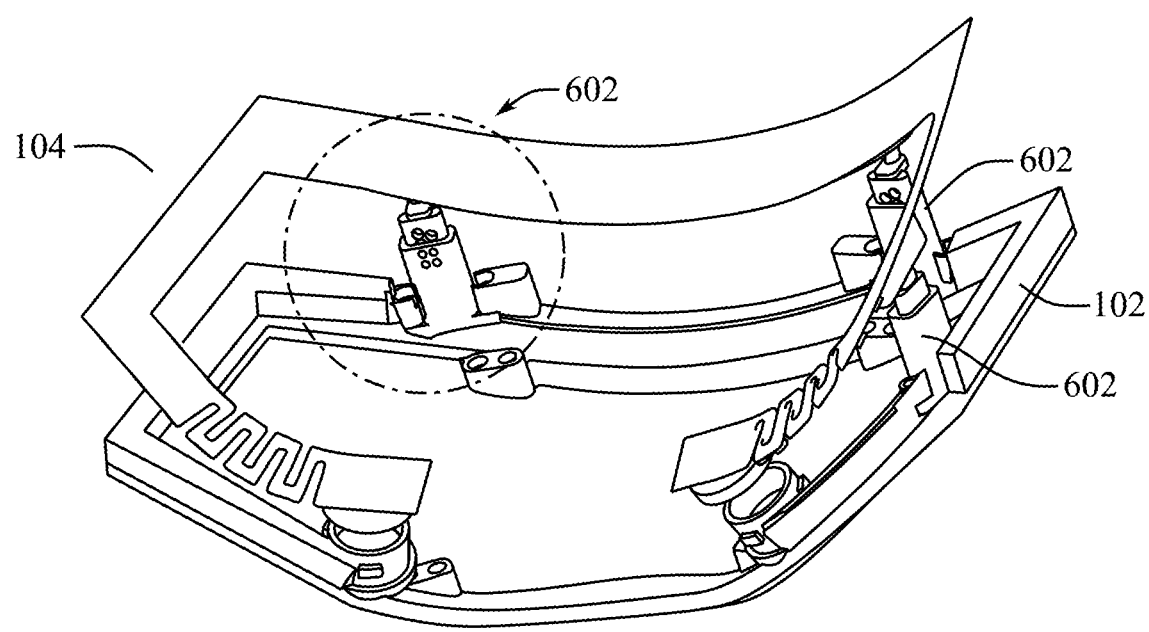
FIGS. 6A-6B show an exemplary adjustment mechanism.
Figure 6B:
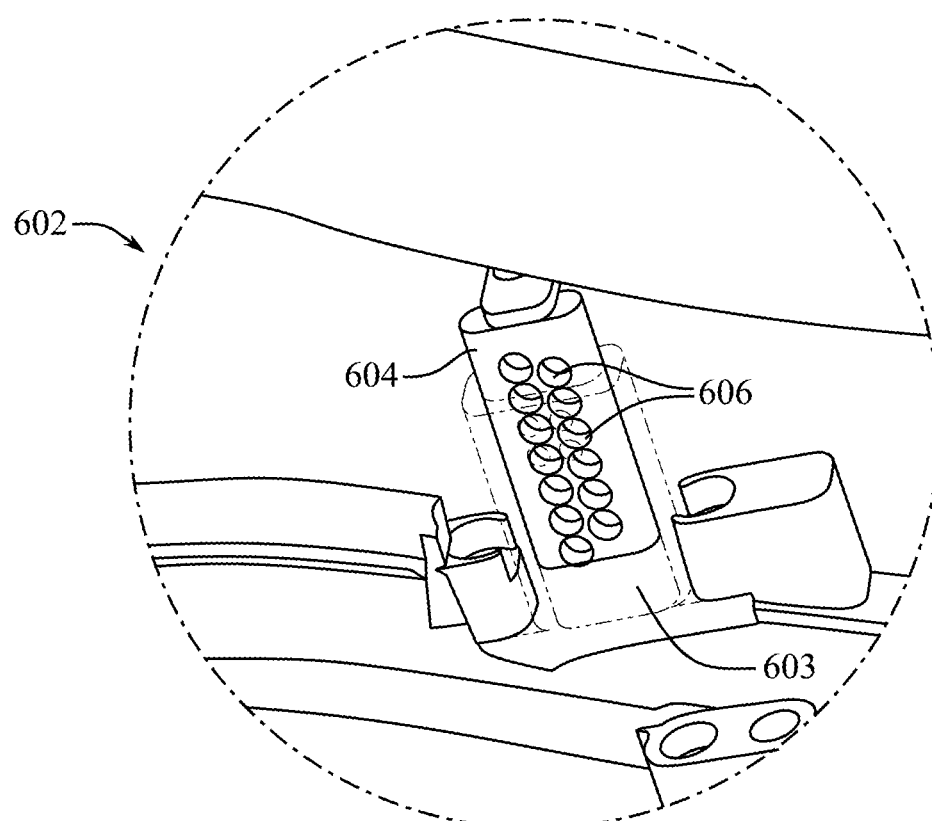

In some cases, the connection(s) 106 can be statically adjusted, customized, or set. For instance, the connection(s) 106 may be adjusted upon initially donning the head-mountable device 100, and thereafter the connection(s) 106 is set without the ability to externally modify the connection(s) 106. That is, the connection(s) 106 nor a corresponding actuator control may be externally accessible when the apparatus is donned (e.g., without some disassembly of the head-mountable device 100). In accordance with one or more such examples, FIGS. 6A-6B illustrate an example head-mountable device 600 with adjustment connections 602 between the display 102 and the facial interface 104. In particular, FIG. 6A shows the head-mountable device assembly, while FIG. 6B provides a zoomed-in view of one of the adjustment connections 602.

The adjustment connections 602 can connectively join the display 102 at a distance from the facial interface 104 (as similarly described above for the connection(s) 106). The adjustment connections 602 can be positioned in myriad different locations. As shown, however, the adjustment connections 602 are positioned in upper corners of the forehead region and at the zygoma regions.

Additionally, the adjustment connections 602 as shown include an adjustable pillar 604. The adjustable pillar 604 is configured to slide into and out of an adjustment connection. Specifically, the adjustable pillar 604 moves relative to a base 603 of the adjustment connection. The adjustable pillar 604 is connected to the facial interface 104, and the base 603 is connected to the display 102. Alternatively, opposite configurations are herein contemplated (e.g., the adjustable pillar 604 connected to the display 102 and the base 603 connected to the facial interface 104). Thus, adjusting the adjustable pillar 604 (in or out of the base 603) causes a corresponding change in distance between the display 102 and the facial interface 104. The adjustable pillar 604 further includes holes 606 configured to receive a set screw (or other fastener) by which the adjustable pillar 604 can be positionally affixed upon setting to the desired position.

The adjustable pillar 604 can include a variety of different specifications (e.g., according to desired load distribution). For example, in some instances, the adjustable pillars 604 are constructed to withstand the compressive force of the strap 103 (not shown) pulling the display 102 towards the facial interface 104. In certain implementations, the adjustment connections 602 can distribute up to a 6 kN applied load (e.g., from the display 102 along the facial interface 104).

Any of the features, components, and/or parts, including the arrangements and configurations thereof shown in FIGS. 6A-6B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 6A-6B.

Figure 7A:
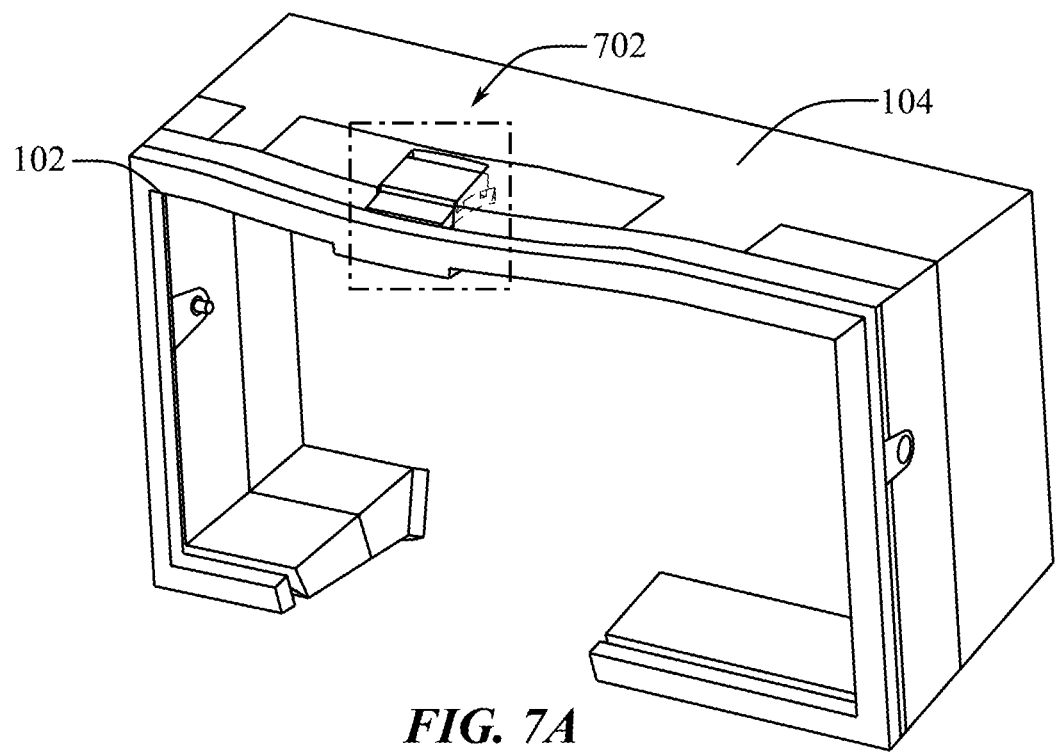
FIGS. 7A-7B show an exemplary rotatable adjustment mechanism.
Figure 7B:
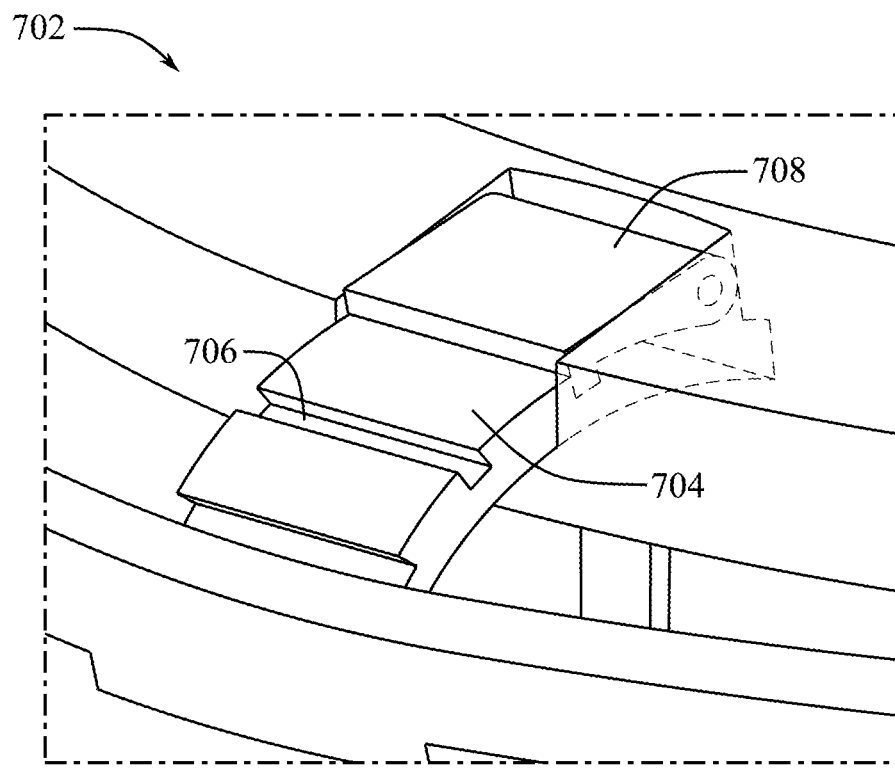

In contrast to static adjustment, the following description for FIGS. 7A-27 discusses various examples of dynamic adjustment (e.g., for different users, head sizes, head shapes, etc.)—where "dynamic" refers to on-the-fly or real time adjustment as may be desired for a given user at a given time. Moreover, as discussed above, the head-mountable device of the present disclosure can include single-point systems with a singular adjustment mechanism. In accordance with one or more examples of the present disclosure, FIGS. 7A-7B show an example head-mountable device 700 including the display 102 and the facial interface 104. In particular, the head-mountable device 700 includes an angular adjustment connection 702 that movably constrains the display 102 relative to the facial interface 104.

The angular adjustment connection 702 specifically includes a linkage 704 attached to the display 102. The linkage 704 includes notches 706 configured to receive a locking element 708, where the locking element 708 is connected to the facial interface 104. The notches 706 correspond to positions at which the locking element 708 can engage the linkage 704 for maintaining a position of the linkage 704.

The display 102 can be moved (e.g., rotated) by sliding the linkage 704 relative to the locking element 708. For example, the linkage 704 allows the display 102 to pivot relative to the facial interface 104 when the linkage 704 extends or the linkage 704 retracts relative to the locking element 708.

In certain implementations, the linkage 704 automatically moves in response to direct manipulation of the display 102. For example, the linkage 704 can extend or retract relative to the locking element 708 in response to user manipulation (e.g., a user hand tilting) of the display 102.

Any of the features, components, and/or parts, including the arrangements and configurations thereof shown in FIGS. 7A-7B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 7A-7B.

Figure 8:
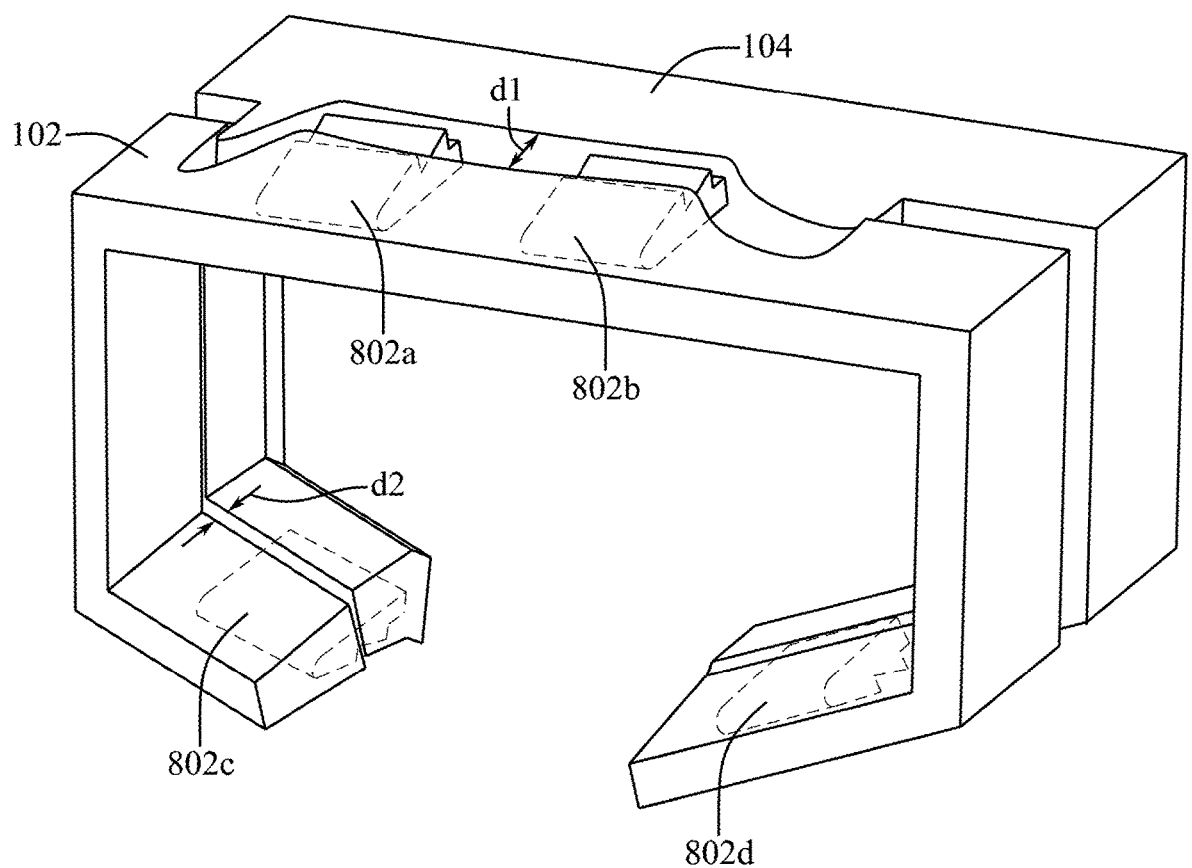
FIG. 8 shows another exemplary adjustment mechanism.

The head-mountable device of the present disclosure can also include a multi-point system where multiple adjustment mechanisms in combination can allow (or provide) multiple degrees of freedom (e.g., multiple directions of display mobility). In accordance with one or more such examples, FIG. 8 illustrates the display 102 and facial interface 104 connected by adjustable connections 802a-802d. The adjustable connections 802a-802d are disposed between the display 102 and the facial interface 104. Each of the adjustable connections 802 can be individually adjusted such that the display and be displaced linearly and/or angularly.

For example, the adjustable connections 802a, 802b can be adjusted so the top of the display is a first distance d1 from the facial interface. The adjustable connections 802c, 802d can be adjusted differently than the adjustable connections 802a, 802b so that the bottom of the display is a second distance d2 from the facial interface 104. In downward tilting cases, the second distance d2 can be less that the first distance d1. By contrast, for upward tilting cases, the second distance d2 can be more than the first distance d1. In this way, the adjustable connections 802a-802d make the angular adjustment connection between the facial interface 104 and the display 102, and the adjustable connections 802 make the linear adjustment connection between the facial interface 104 and the display 102.

As another example, the adjustable connections 802a-802d can be adjusted in other ways. For instance, the adjustable connections 802a-802d can be adjusted in a same or similar fashion (e.g., all lengthened or retracted by a same distance) to linearly translate the display 102 towards or away from the facial interface 104.

Any of the features, components, and/or parts, including the arrangements and configurations thereof shown in FIG. 8 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 8.

Where FIGS. 6-8 depict example adjustment mechanisms without actuator controls (moving instead via direct user manipulation or setting of the head-mountable device), the following figures depict adjustment mechanisms with dynamic actuator controls. Indeed, as mentioned above, the connections (i.e., adjustment mechanisms or actuators) of the present disclosure can include adjustment controls configured for myriad different modes of user input and in various locations. In accordance with one or more such embodiments, FIGS. 9A-24B show example adjustment mechanism variations of the head-mountable device 100. In particular, the head-mountable device 100 includes the display 102, the facial interface 104, and the strap 103 (each described above).

In addition, FIGS. 9A-24B respectively depict front and side-view profiles of head-mountable devices 900-2400 with corresponding connections 902-2402 (which are the same as or similar to the connection(s) 106 also described above). The connections 902-2402 movably constrain the display 102 relative to the facial interface 104. The connections 902-2402 can therefore include myriad different forms of connections (e.g., mechanical connections) as indicated previously. Further, the connections 902-2402 can include myriad different forms of control mechanisms (e.g., actuator controls) that actuate the connections 902-2402 in response to user input.

In many examples, the head-mountable devices 900-2400 include actuator controls such as levers (e.g., side peel lever, vertical slide lever, etc.), buttons (push-button, side push button, top push button, automatic release button, etc.), dials (vertical scroll wheel dial, horizontal scroll wheel dial, top scroll wheel dial, etc.), rockers, sliders, or toggles. The actuator controls can be combined with multiple control mechanisms. For example, a sliding actuator controller can include a lever which can be user to lock a head-mountable device in position at the desired viewing state. In another example, a combined actuator control may include a rocker combined with a scroll wheel, such that the scroll wheel, when engaged by the rocker rotates, causing a change in distance between the display 102 and the facial interface 104. It can be appreciated that a number of variations and examples are contemplated herein and the examples provided below serve to illustrate a few of the possible configurations.

Figures 9A, 9B:
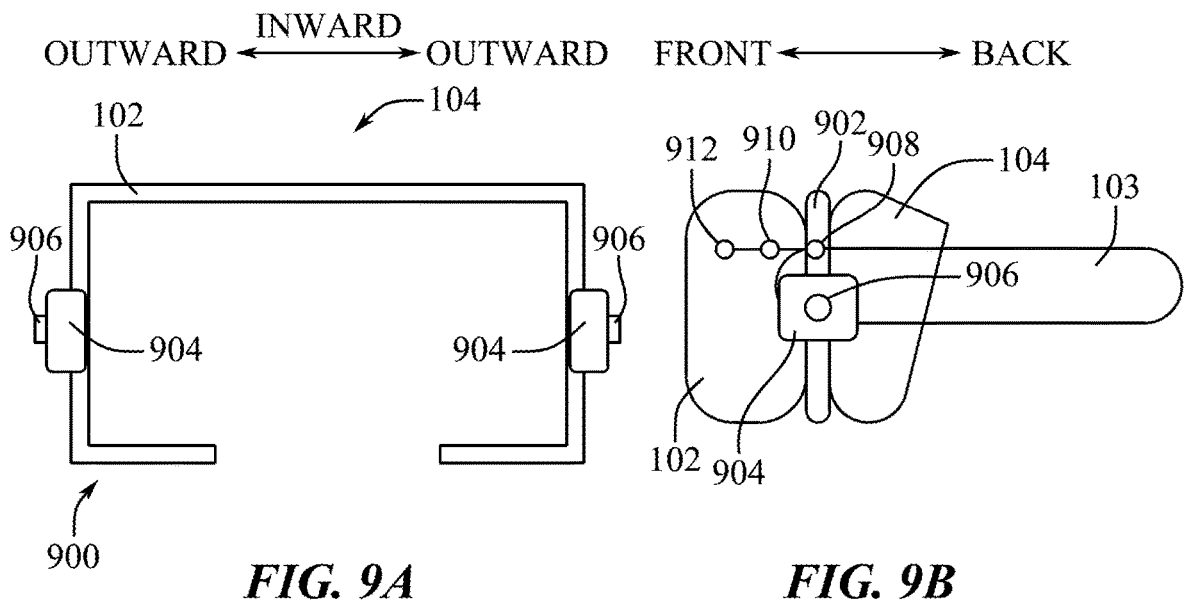

FIGS. 9A-9B illustrate a head-mountable device 900 with a connection 902. The connection 902 includes an actuator control 904. The actuator control 904 is positioned on a side portion of the display 102 or the facial interface 104. The actuator control 904 includes a side push button 906. In response to actuation of the side push button 906 (e.g., an inward push, press, tap), the connection 902 can translate the display 102 to or from a first state 908, a second state 910, or a third state 912. Although FIGS. 9A-9B illustrate discrete states or positions (i.e., the first state 908, the second state 910, and the third state 912), it will be appreciated that head-mountable device 900 can include more or fewer positional states. In certain implementations, the head-mountable device 900 includes a continuous resolution of positional states (as opposed to discrete, predetermined positional states).

In one or more examples, the side push button 906 can be actuated in various ways. For instance, the side push button 906 can include a push-to-release button, a push-and-hold button, slide-push buttons, top-push buttons, etc.). The buttons can be located in various locations (e.g., top portion, side portion, bottom portion, etc.) of the head-mountable device 900, either on the display 102 or on the facial interface 104.

Figures 10A, 10B:
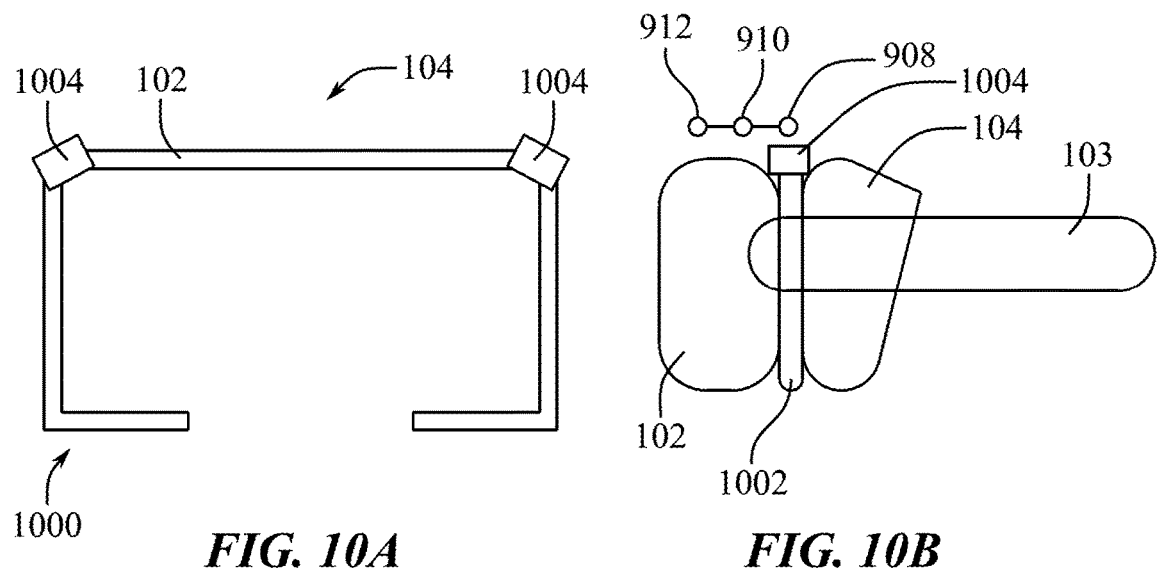

FIGS. 10A-10B illustrate a head-mountable device 1000 with a connection 1002. The connection 1002 includes an actuator control 1004. The actuator control 1004 is similar to the actuator control 904. In particular, the actuator control 1004 includes a top push button positioned at a top portion of the display 102 or the facial interface 104 (e.g., at one or both top corners of the head-mountable device 1000). When the actuator control 1004 is pressed, the connection 1002 can translate the display 102 to or from the first state 908, the second state 910, or the third state 912, as described above.

In another example, the head-mountable device 100 includes actuation components that have actuator controls that slide or twist (e.g., by levers, buttons, rotatable components, etc.) causing the display 102 to move relative to the facial interface 104. FIGS. 11A-14B illustrate such examples.

In particular, FIGS. 11A and 11B illustrate a head-mountable device 1100 with a connection 1102. The connection 1102 includes an actuator control 1104. The actuator control 1104 is positioned on a side portion of the display 102 or the facial interface 104. The actuator control 1104 includes a side peel lever. The side peel lever of the actuator control 1104, when pulled downward, releases a lock (e.g., a cam lock) allowing the connection 1102 to move the display 102 relative to the facial interface 104. Additionally, the actuator control 1104, when pushed upward into a locked position, causes the connection 1102 to lock the display 102 into position relative to the facial interface 104.

FIGS. 12A and 12B illustrate a head-mountable device 1200 with a connection 1202. The connection 1202 includes an actuator control 1204. The actuator control 1204 is also positioned on a side portion of the display 102 or the facial interface 104. The actuator control 1204 includes a twist sleeve lever. Thus, the twist sleeve lever of the actuator control 1204 can rotate (e.g., outward in a clockwise direction), allowing the connection 1202 to move the display 102 relative to the facial interface 104. Likewise, the actuator control 1204 can be rotated in an opposite direction (e.g., inward in a counterclockwise direction), allowing the connection 1202 to positionally fix the display 102 relative to the facial interface 104.

FIGS. 13A and 13B illustrate a head-mountable device 1300 with a connection 1302. The connection 1302 includes an actuator control 1304. The actuator control 1304 is similarly positioned on a side portion of the display 102 or the facial interface 104. The actuator control 1304 includes a finger pinch slider. The finger pinch slider of the actuator control 1304 can slide frontwards and backwards allowing the connection 1302 to positionally move (or lock) the display 102 relative to the facial interface 104.

FIGS. 14A and 14B illustrate a head-mountable device 1400 with a connection 1402. The connection 1402 includes an actuator control 1404. The actuator control 1404 is positioned on a side portion of the display 102 or the facial interface 104. The actuator control 1404 includes a sleeve slide. The sleeve slide of the actuator control 1404 can slide along the actuator control 904 allowing the connection 1402 to move the display 102 relative to the facial interface 104.

Figures 15A, 15B:
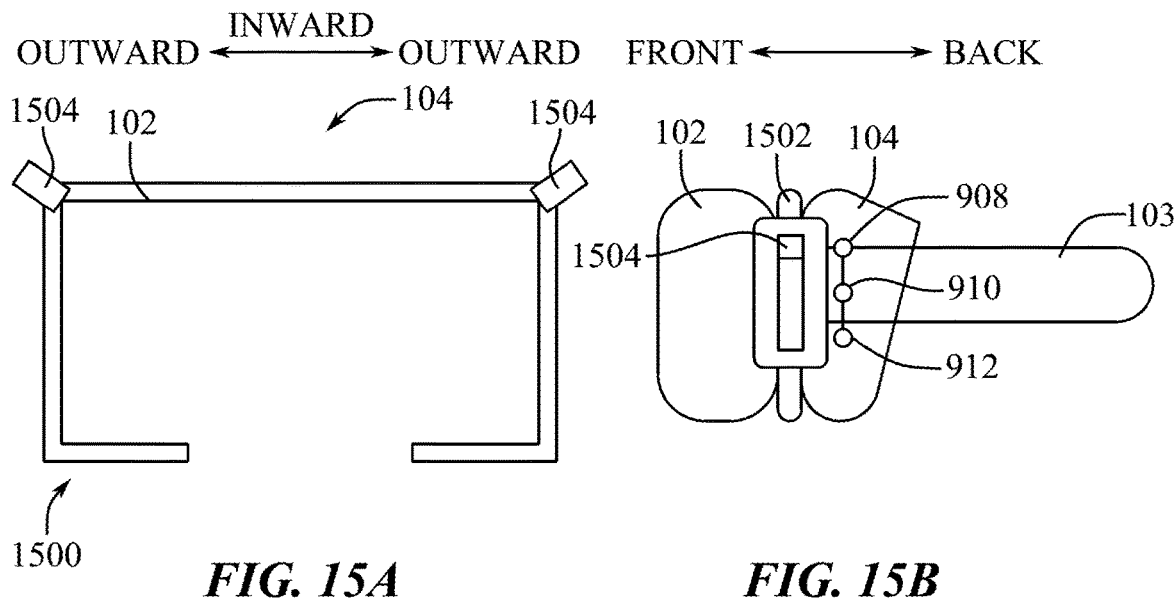

FIGS. 15A and 15B illustrate a head-mountable device 1500 with a connection 1502. The connection 1502 includes an actuator control 1504. The actuator control 1504 is positioned along an outer periphery of the head-mountable device 1500 (e.g., from top to bottom corners at a side portion of the display 102 or the facial interface 104). The actuator control 1504 includes a vertical slide that moves approximately up and down along the outer periphery of the head-mountable device 1500. The vertical slide of the actuator control 1504 can be toggled between positions (e.g., the first state 908, the second state 910, and the third state 912). Additional detail of this embodiment is discussed further below in relation to FIGS. 25A-25D.

Figures 16A, 16B:
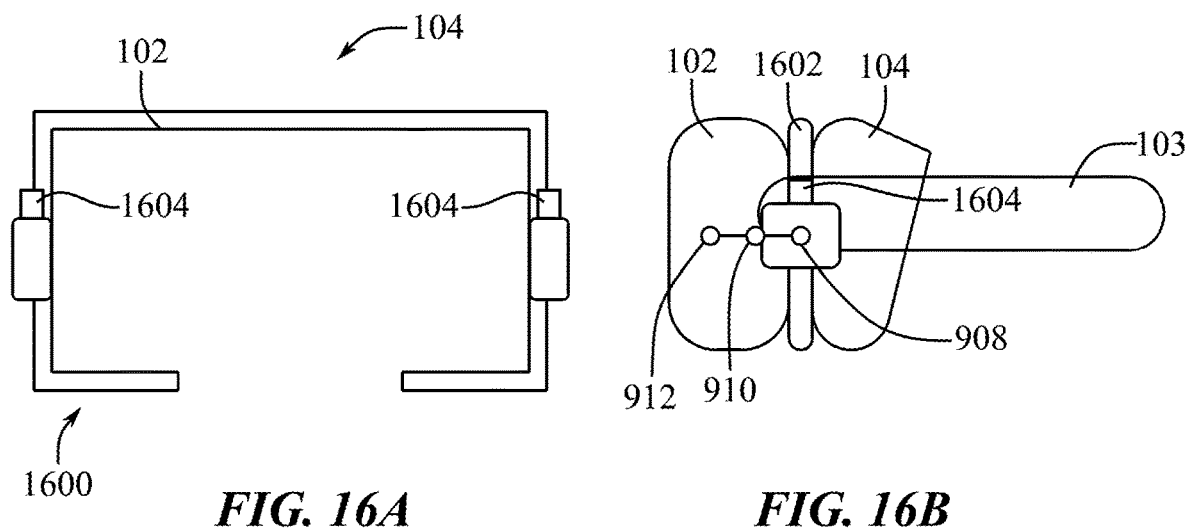

FIGS. 16A and 16B illustrate a head-mountable device 1500 with a connection 1602. The connection 1602 includes an actuator control 1604. The actuator control 1604 is positioned on a side portion of the display 102 or the facial interface 104. The actuator control 1604 includes a side temple squeeze button (e.g., spring button) that, when squeezed, allows the connection 1602 to contemporaneously move the display 102 relative to the facial interface 104. The side temple squeeze button of the actuator control 1604 can automatically release when one of the first state 908, the second state 910, or the third state 912 is reached. The side temple squeeze button of the actuator control 1604 can have the button oriented upward (or in alternative cases, downward) relative to the head-mountable device 1600.

Figures 17A, 17B:
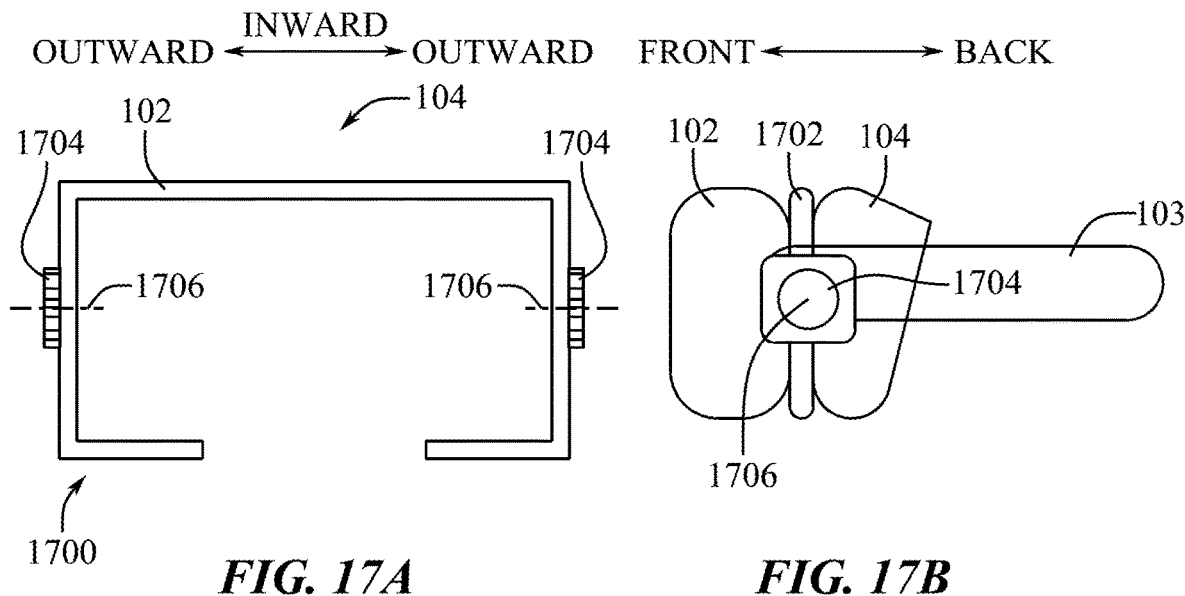

FIGS. 17A and 17B illustrate a head-mountable device 1700 with a connection 1702. The connection 1702 includes an actuator control 1704. The actuator control 1704 is positioned on a side portion of the display 102 or the facial interface 104. The actuator control 1704 includes a scroll wheel rotatable about an axis 1706 proceeding inward and outward of the head-mountable device 1700. In some examples, the scroll wheel of the actuator control 1704 rotates in response to tangential forces (e.g., a finger swipe from front to back or up and down). In other examples, the scroll wheel of the actuator control 7104 rotates in response to twisting fingers. The scroll wheel of the actuator control 1704, when rotated about the axis 1706, can cause the connection 1702 to correspondingly adjust the distance between the display 102 and the facial interface 104.

Figures 18A, 18B:
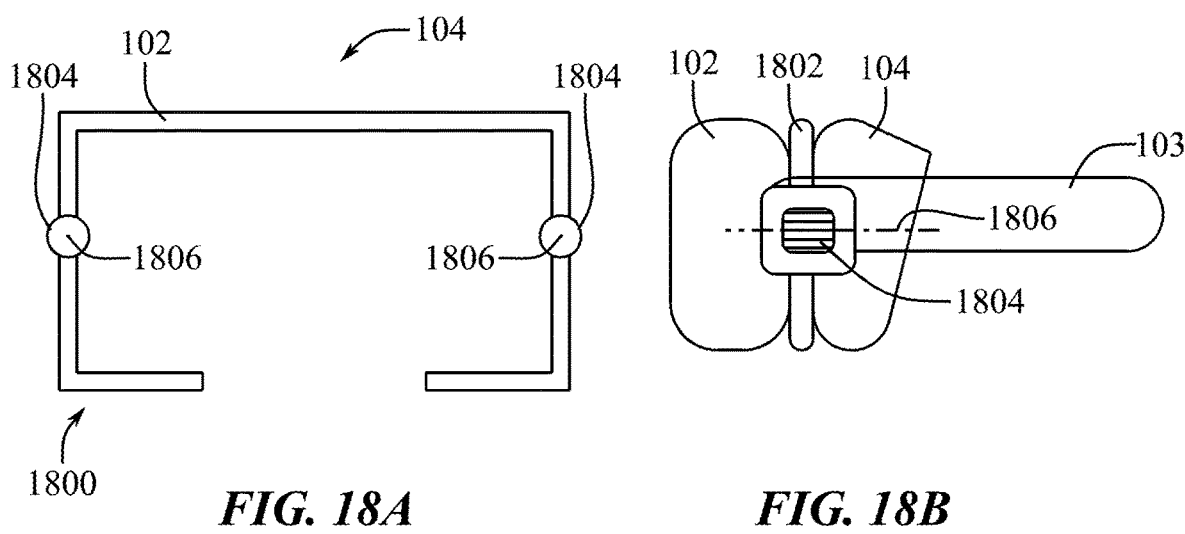

FIGS. 18A and 18B illustrate a head-mountable device 1800 with a connection 1802. The connection 1802 includes an actuator control 1804. The actuator control 1804 is positioned on a side portion of the display 102 or the facial interface 104. The actuator control 1804 includes a scroll wheel rotatable about an axis 1806. The actuator control 1804, like the actuator control 1704, can respond to tangential forces (such as a finger swipe up or down). The scroll wheel of the actuator control 1804, when rotated about the axis 1806, can cause the connection 1802 to correspondingly adjust the distance between the display 102 relative to the facial interface 104.

FIGS. 19A and 19B illustrate a head-mountable device 1900 with a connection 1902. The connection 1902 includes an actuator control 1904. The actuator control 1904 is positioned on a side portion of the display 102 or the facial interface 104. The actuator control 1904 is similar to the actuator control 1804. In particular, the actuator control 1904 includes a scroll wheel rotatable about an axis 1906. The scroll wheel of the actuator control 1904 can therefore respond to tangential forces (e.g., a finger swipe front to back, and vice-versa). In response to this user interaction, the connection 1902 can move the display 102 relative to the facial interface 104.

FIGS. 20A and 20B illustrate a head-mountable device 2000 with a connection 2002. The connection 2002 includes an actuator control 2004. The actuator control 2004 includes a slider (e.g., toggle) positioned on the top region of the display 102 or the facial interface 104 (e.g., along a forehead region). The actuator control 904 moves laterally (e.g., inward and outward) to correspondingly cause the connection 2002 to adjust the distance between the display 102 relative to the facial interface 104 (e.g., frontwards or backwards).

FIGS. 21A and 21B illustrate a head-mountable device 2100 with a connection 2102. The connection 2102 includes an actuator control 2104. The actuator control 2104 includes a rocker positioned on the top region of the display 102 or the facial interface 104. The actuator control 2104 moves up or down about a pivot 2106. In response to up/down actuation of the actuator control 2104, the connection 2102 adjusts the distance between the display 102 relative to the facial interface 104.

FIGS. 22A-24B illustrate an actuator control that includes a scroll wheel disposed on top of a head-mountable device. The scroll wheel can be rotated around different axes to adjust the distance between the display 102 relative to the facial interface 104. Further detail is provided below.

In particular, FIGS. 22A and 22B illustrate a head-mountable device 2200 with a connection 2202. The connection 2202 includes the actuator control 1804 described above. Here, however, the actuator control 1804 is positioned on a top portion of the display 102 or the facial interface 104. Indeed, the actuator control 1804 includes a scroll wheel rotatable about an axis 2204. The scroll wheel of the actuator control 1804, when rotated up or down about the axis 2204, causes the connection 2202 to adjust the distance between the display 102 relative to the facial interface 104.

FIGS. 23A and 23B illustrate a head-mountable device 2300 with a connection 2302. The connection 2302 also includes the actuator control 1804 described above. Differently though, the actuator control 1804 is positioned on a top portion of the display 102 or the facial interface 104. The actuator control 1804 also includes a scroll wheel rotatable about an axis 2304. The scroll wheel of the actuator control 1804, when rotated up or down about the axis 2304, causes the connection 2302 to adjust the distance between the display 102 relative to the facial interface 104.

FIGS. 24A and 24B illustrate a head-mountable device 2400 with a connection 2402. The connection 2402 includes the actuator control 1704 described above, albeit differently located in FIGS. 24A-24B. In particular, the actuator control 1704 is positioned on a top portion of the display 102 or the facial interface 104. The actuator control 1704 includes a scroll wheel rotatable about an axis 2404. The scroll wheel of the actuator control 1704, when rotated about the axis 2404, causes the connection 2402 to adjust the distance between the display 102 relative to the facial interface 104.

Any of the features, components, and/or parts, including the arrangements and configurations thereof shown in FIGS. 9A-24B can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 9A-24B.

Figure 25A:
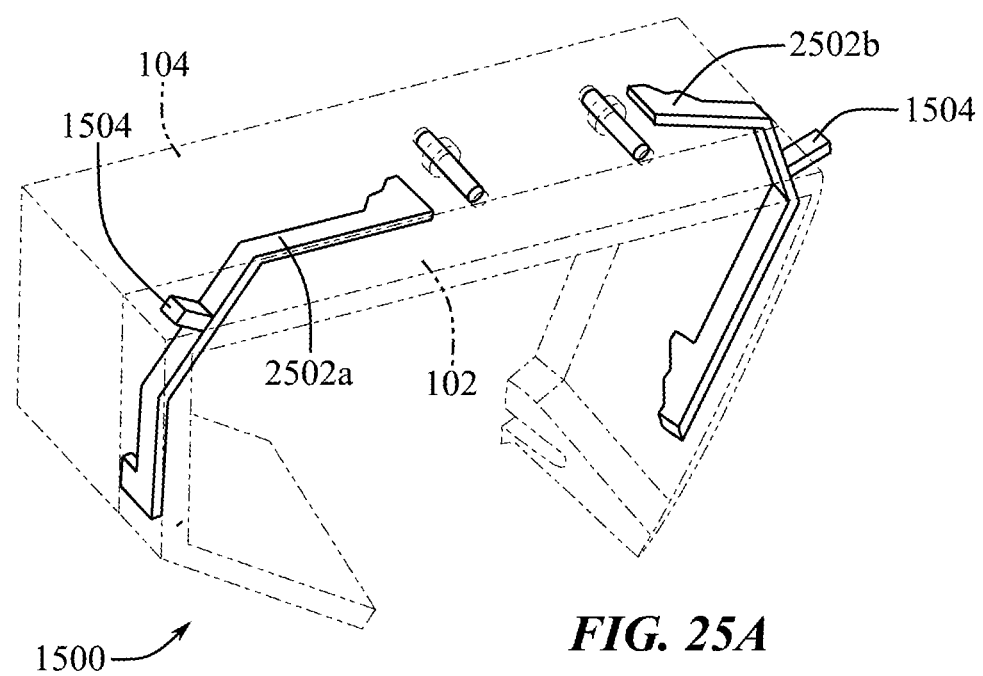
FIGS. 25A-25D show an example head-mountable device with an example connection and corresponding actuator control.

As discussed above, a head-mountable device of the present disclosure can include connections (e.g., adjustment mechanisms) that can toggle from position to position via a sliding actuation. In accordance with one or more such examples, FIG. 25A shows a perspective view of the head-mountable device 1500 shown in FIGS. 15A and 15B. The head-mountable device 1500 includes connections 2502a, 2502b having an actuator control 1504. The actuator control 1504 includes a handle or lever that juts out from the head-mountable device 1500 for convenient user manipulation of the connections 2502a, 2502b (e.g., a sliding motion along the periphery of the head-mountable device 1500).

As shown, user interaction with the actuator control 1504 can move the connections 2502a, 2502b in a manner that toggles the connections 2502a, 2502b between three discrete states (e.g., positions) including the first state 908, the second state 910, and the third state 912. The connections 2502a, 2502b are independently movable. In other implementations, however, the connections 2502a, 2502b are movably connected to each other. It will be appreciated that the connections 2502a, 2502b can move within the head-mountable device 1500 in myriad different ways. In particular examples, the connections 2502a, 2502b follow a track having a constant radius.

Figure 25B:
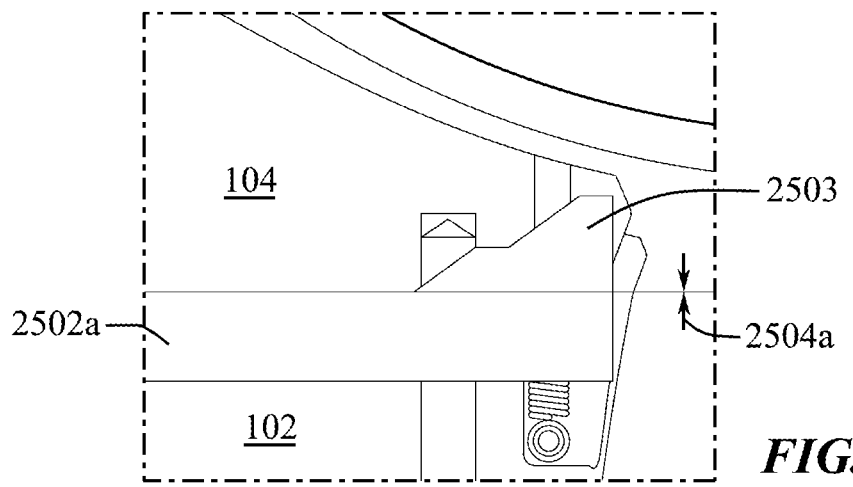

As the connections 2502a, 2502b move, the display 102 correspondingly moves relative to the facial interface 104. The particular movement of the connections 2502a, 2502b causing the head-mountable device adjustment is described below in relation to FIGS. 25B-25D (depicting the connection 2502a in greater detail). In particular, FIG. 25B illustrates the connection 2502a including a stepped adjustment portion 2503 in a first state. In the first state, the facial interface 104 and the display 102 are positioned a distance 2504a apart (e.g., about zero mm).

Figure 25C:
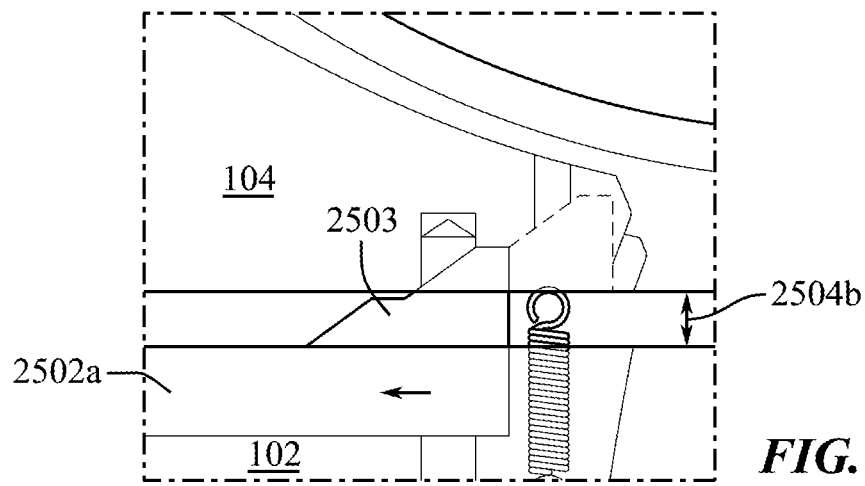
Figure 25D:
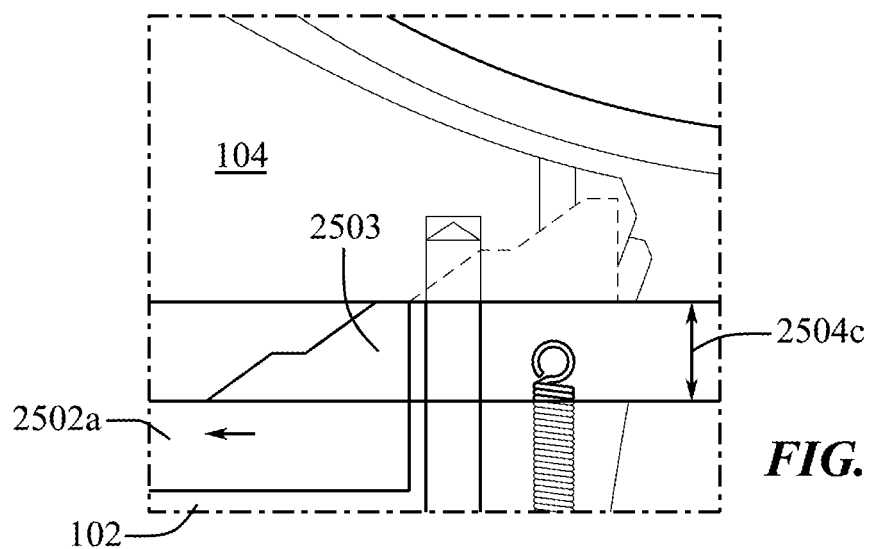

By contrast, FIG. 25C illustrates the connection 2502a moving left as indicated in the provided arrow. In doing so, the stepped adjustment portion 2503 correspondingly moves in a stepwise fashion, thereby creating increased separation between the display 102 and the facial interface 104 of a distance 2504b (e.g., about 3 mm) to a second positional state. Still further, FIG. 25D illustrates the connection 2502a moving further left as indicated in the provided arrow. With this additional movement, the stepped adjustment portion 2503 moves another step to create more separation between the display 102 and the facial interface 104 of a distance 2504c (e.g., about 6 mm) to a third positional state. Thus, the geometry or structure of the stepped adjustment portion 2503 can provide a desired stepwise resolution between positional states by causing the display 102 to move away from (or towards) the facial interface 104.

Any of the features, components, and/or parts, including the arrangements and configurations thereof shown in FIGS. 25A-25D can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 25A-25D.

As briefly mentioned above, multiple connections of a head-mountable device can be linked together as a single connection. The links between connections of a head-mountable device form a timing mechanism that causes the connections to move together uniformly. In accordance with one or more such examples, FIGS. 26-27 illustrate respective perspective views of assemblies 2600-2700 for head-mountable devices.

Figure 26:
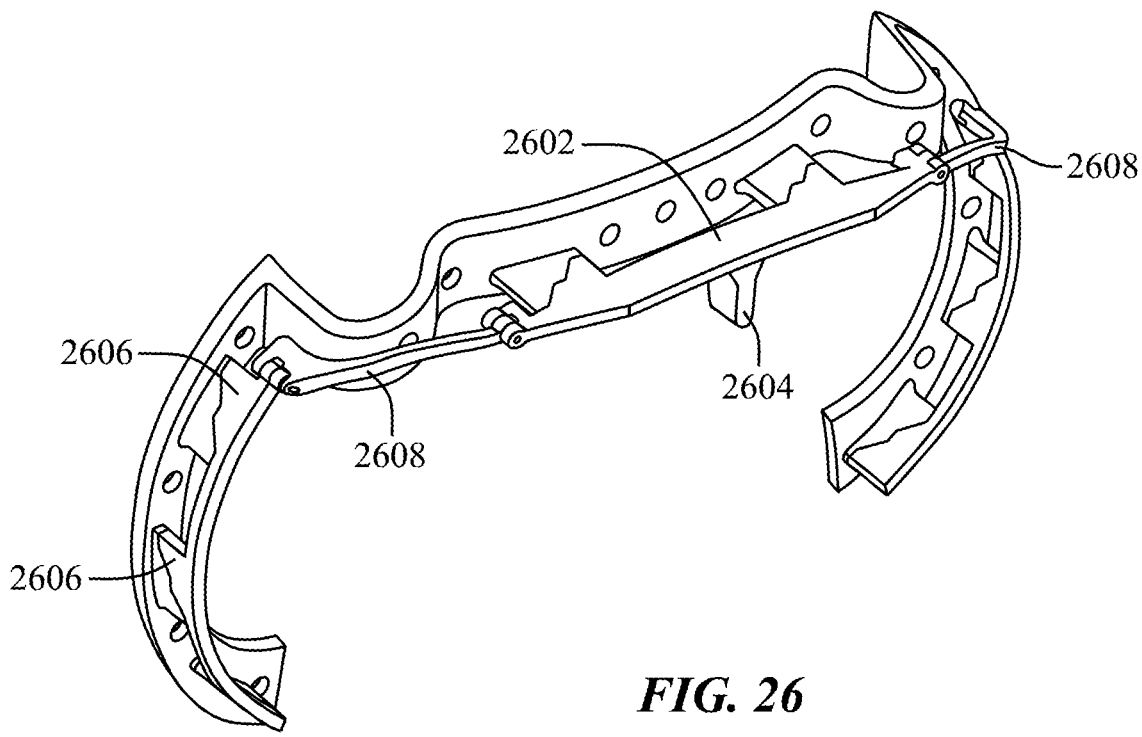
FIG. 26 shows an example connection of a head-mountable device.

In particular, FIG. 26 depicts the assembly 2600 for a head-mountable device with a connection 2602 that is movably adjustable via an actuator control 2604. The actuator control 2604 is positioned along a forehead region, but oriented downward (albeit myriad other orientations are herein contemplated). In response to actuation of the actuator control 2604, stepped adjustment portions 2606 each move in unison in a stepwise fashion (as similarly described above for the stepped adjustment portion 2503 in relation to FIGS. 25B-25D). Linkage arms 2608 movably connect portions of the connection 2602 to provide such a timing mechanism that transfers motion in a coordinated manner. While FIG. 26 illustrates stepped adjustment portions 2606, the adjustment portions can have additional steps or even a gradual incline surface that provides a finer adjustment capability.

Figure 27:
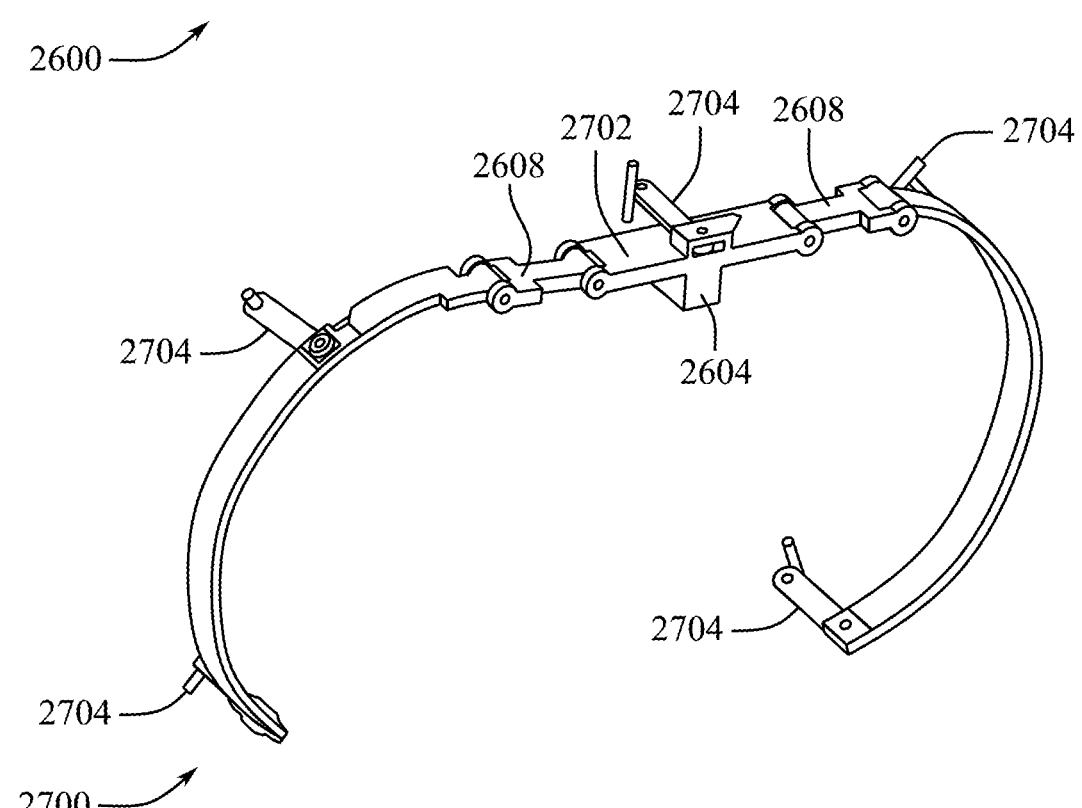
FIG. 27 shows another example connection of a head-mountable device.

In contrast to stepped adjustment portions, FIG. 27 depicts the assembly 2700 for a head-mountable device with a connection 2702 with toggle links. In particular, the connection 2702 is movably adjustable via the actuator control 2604. In response to actuation of the actuator control 2604, toggle links 2704 toggle between stowed and locked positions. When the toggle links 2704 move in unison, the display 102 correspondingly moves relative to the facial interface 104. Moreover, in this configuration, the connection 2702 moves in binary fashion between a first positional state and a second positional state. The linkage arms 2608 in FIG. 27 also movably connect portions of the connection 2702 to provide such a timing mechanism that transfers motion in a coordinated manner.

Any of the features, components, and/or parts, including the arrangements and configurations thereof shown in FIGS. 26-27 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 26-27. The following figure descriptions for FIGS. 28-33 relate to example head-mountable devices, wearable apparatuses, or wearable electronic devices that can implement two degrees of freedom—namely angular tilt and linear translation toward and away from the user's face. In these examples, a linear slide can be implemented with certain structure to control actuation of the linear slide (whether in response to user adjustment or an applied force).

Figure 28:
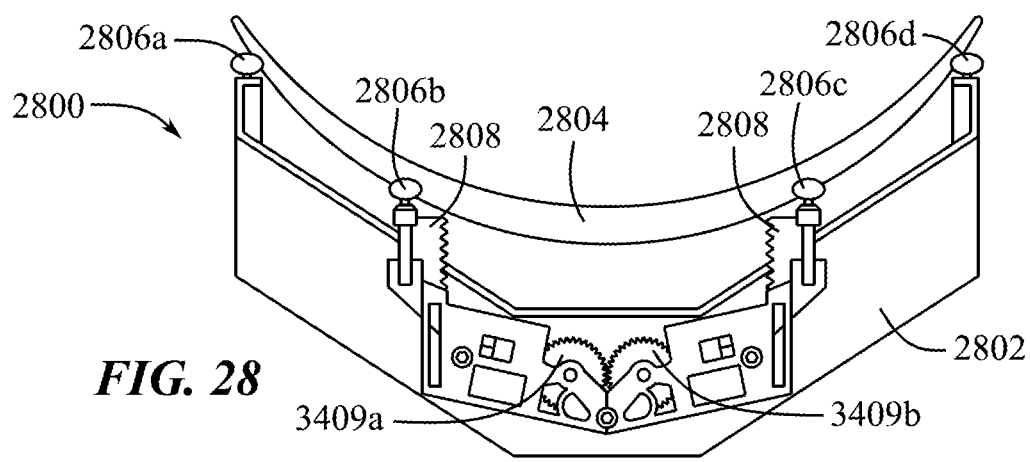
FIGS. 28-30 respectively show top, front, and side views of another example head-mountable device.
Figure 29:
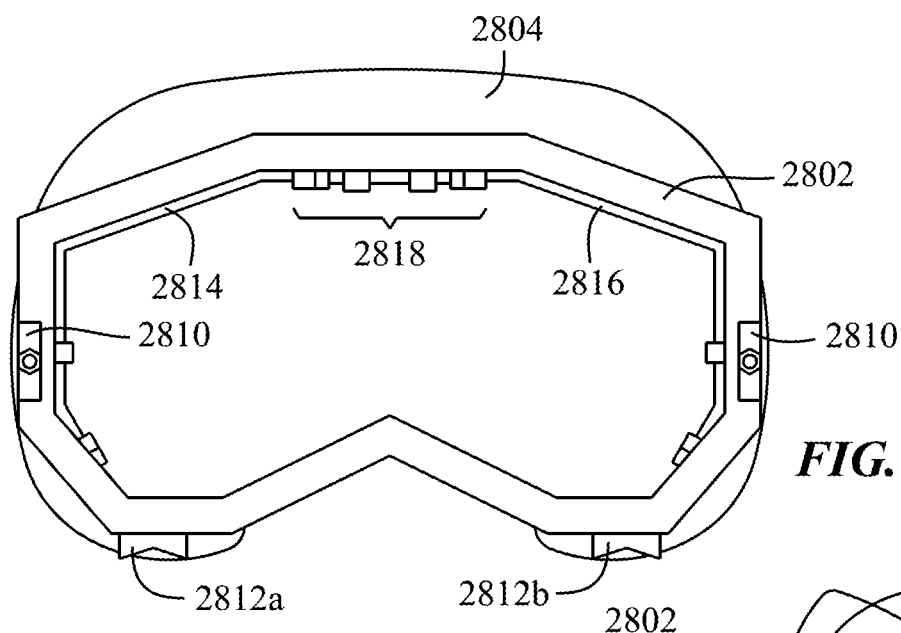
Figure 30:
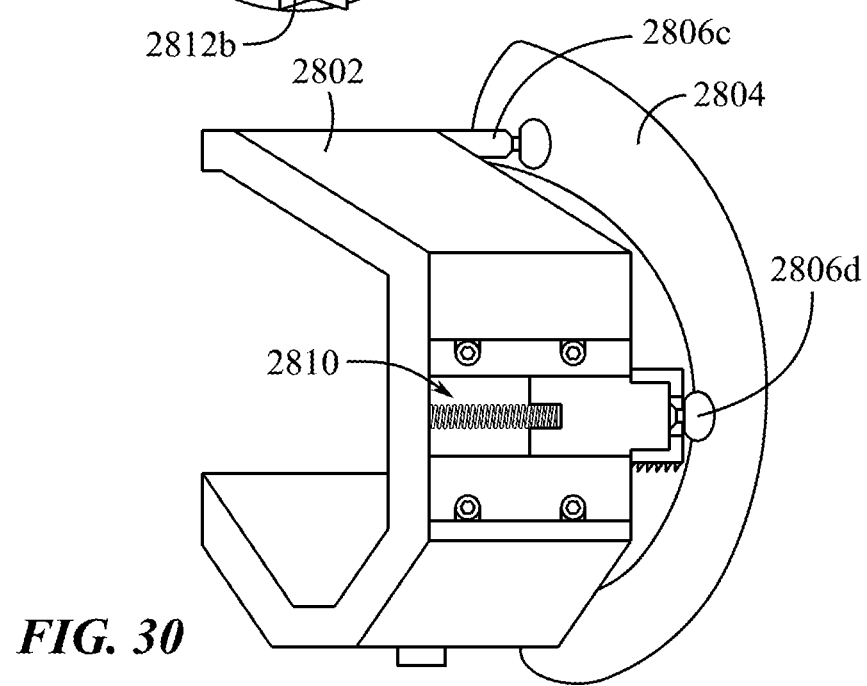

FIGS. 28-30 illustrate top, front, and side views, respectively, of a head-mountable device 2800 in accordance with one or more examples of the present disclosure. As shown, the head-mountable device 2800 can include a display frame 2802, a facial interface 2804, and connections 2806a-2806d. The display frame 2802 and associated display can be the same as, or similar to, the display frame 105 (and associated display 102) discussed above. The facial interface 2804 can be the same as, or similar to, the facial interface 104 discussed above. Likewise, the connections 2806a-2806d can be the same as or similar to the connection(s) 106 discussed above.

In particular, however, the head-mountable device 2800 can include actuators 2808, 2810. The actuators 2808, 2810 can include a variety of different actuators. In particular examples, the actuators 2808, 2810 include linear actuators of a linear adjustment system (e.g., that facilitate translational movement of the facial interface 2804 toward or away from the display frame 2802). For instance, the actuators 2808, 2810 can include linear slides and/or linear springs that can translate in and out to vary a distance (e.g., a depth distance, eye relief, etc.) between the facial interface 2804 and the display frame 2802. In particular, the actuators 2808 correspond to forehead actuators or top actuators, and the actuators 2810 correspond to zygoma actuators or side actuators. It will be appreciated that additional or alternative configurations of the actuators 2808, 2810 are herein contemplated. For instance, actuators can be positioned in the cheek (maxilla region) along a bottom portion of the head-mountable device 2800. Additional details regarding the actuators 2808, 2810 are described below in relation to FIGS. 31-33.

In some examples, the actuators 2808, 2810 are controlled or manipulated via at least one of actuator controls 2812a, 2812b. In these or other examples, the actuator controls 2812a, 2812b can include a variety of different types of controls, such as a lever, button, dial, rocker, slider, or toggle (as described above). The actuator controls 2812a, 2812b can be engaged via manual manipulation and/or via hands-free or automated methods (also mentioned above). The actuator controls 2812a, 2812b can be positioned in various locations on or within the head-mountable device 2800. In particular examples, the actuator controls 2812a, 2812b can be positioned adjacent to a maxilla region of a human face when the head-mountable device 2800 is donned. Other example positions for the actuator controls 2812a, 2812b can include the zygoma region, forehead region, on the arms (not shown), or within an interior portion of the optical space adjacent the display.

In these or other examples, the actuator controls 2812a, 2812b can control or manipulate the actuators in a variety of ways. In some examples, the actuator controls 2812a, 2812b are connected to flexible drive shafts 2814, 2816. In particular examples, the flexible drive shafts 2814, 2816 can transfer energy or movement from engagement (e.g., depression) of at least one of the actuator controls 2812a, 2812b to the actuators 2808, 2810 (or associated locks, as described below). Examples of the flexible drive shafts 2814, 2816 can include cables, tensioned wires, rods, dowels, etc. In some examples, the flexible drive shafts 2814, 2816 are positioned inside the display frame 2802 (hidden from exterior viewing). In other examples, the flexible drive shafts 2814, 2816 are positioned externally (e.g., on an outside surface of the display frame 2802).

In at least some examples, the flexible drive shafts 2814, 2816 can provide synchronized movement or parallel motion for each of the actuators 2808, 2810. For example, the flexible drive shafts 2814, 2816 can be connected to each other via a linkage 2818. Examples of the linkage 2818 include a gear system, a pulley system, a pivot connection, etc.

The flexible drive shafts 2814, 2816 can be motion-synchronized via the linkage 2818 to mitigate (or prevent) uneven translation between the actuators 2808, 2810. Further, in some examples, the linkage 2818 can allow a single input to one of the actuators 2808, 2810 to control both of the flexible drive shafts 2814, 2816. That is, in certain implementations, engagement of both of the actuator controls 2812a, 2812b is not required to actuate all of the actuators 2808, 2810 (and/or their corresponding locks, described below).

Any of the features, components, and/or parts, including the arrangements and configurations thereof shown in FIGS. 28-30 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 28-30. The following figure descriptions in relation to FIGS. 31-33 relate to specific examples of the actuators 2808, 2810 discussed above. Indeed, the actuators 2808, 2810 can include a linear adjustment connection between the display and the facial interface, where the linear adjustment connection includes a linear slide actuator with a locking mechanism.

Figure 31:
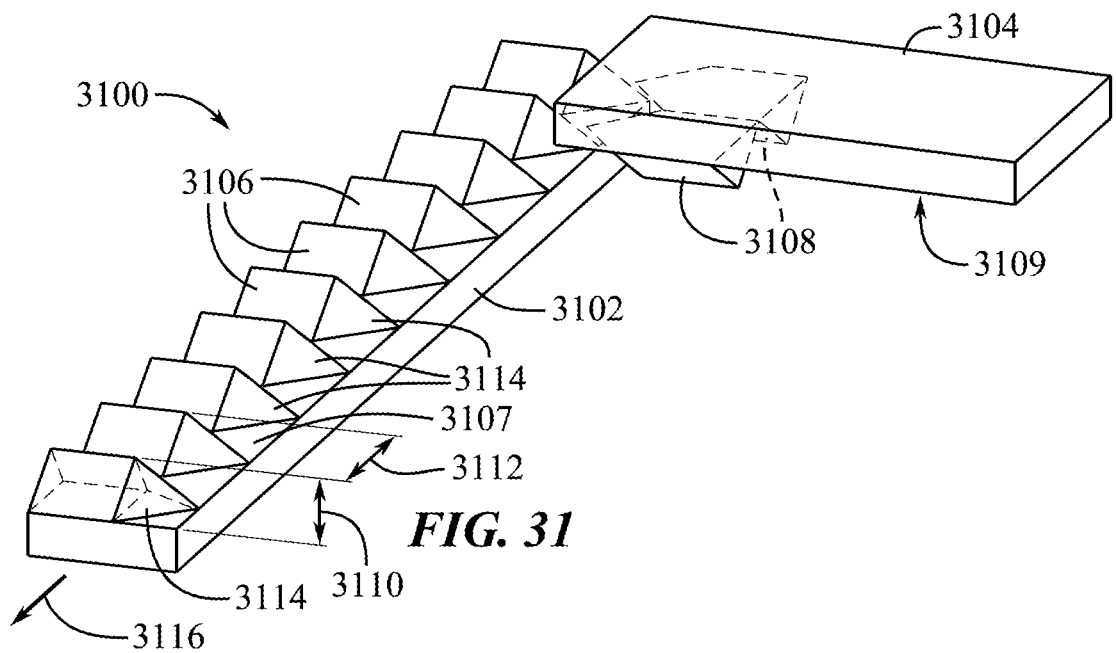
FIGS. 31-33 respectively show a perspective view of lock-slider disengagement, a front view of lock-slider disengagement, and a front view of lock-slider engagement of a portion of a linear adjustment connection.
Figure 32:
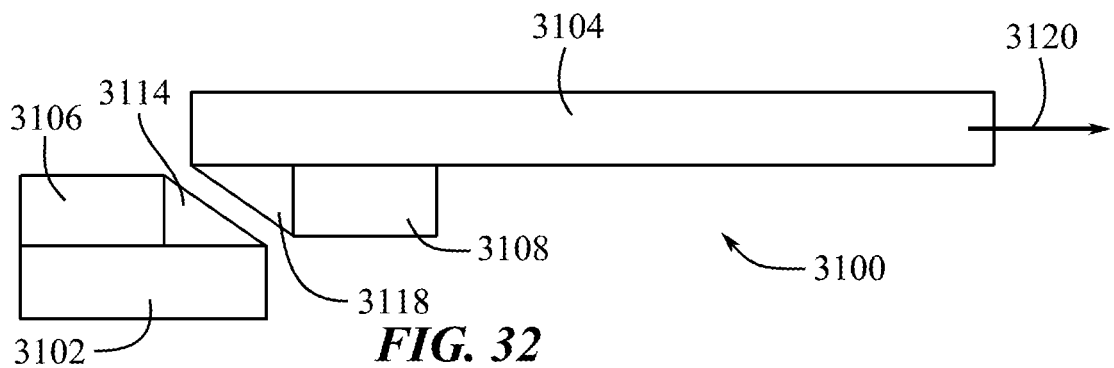
Figure 33:
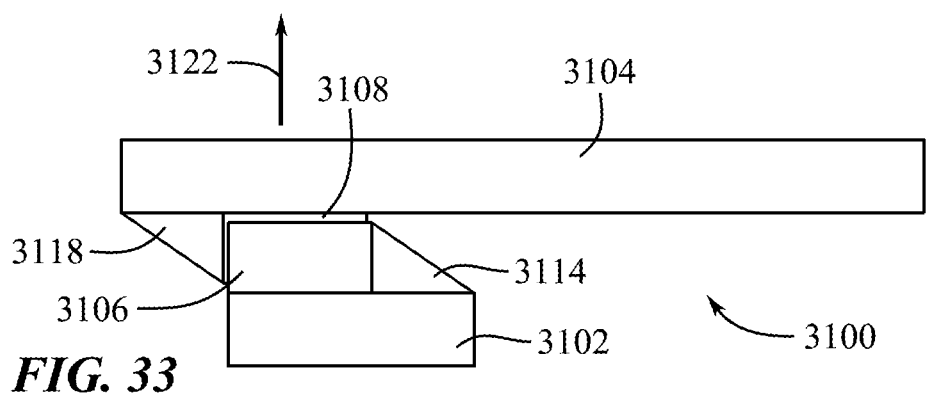

FIGS. 31-33 respectively illustrate a perspective view of lock-slider disengagement, a front view of lock-slider disengagement, and a front view of lock-slider engagement of a portion of a linear adjustment connection 3100 in accordance with one or more examples of the present disclosure. In these or other examples, the linear adjustment connection 3100 includes an actuator 3102 (i.e., a linear slide), an actuator lock 3104 (otherwise referred to as a lock), and an actuator control (e.g., the actuator controls 2812a, 2812b not shown). As will be discussed below, in response to an actuator control, the actuator lock 3104 can engage the actuator 3102 to hold the actuator 3102 in position, or else to release the actuator 3102 for desired adjustability.

As shown, the actuator 3102 can be designed to translate in a slide direction 3116 (e.g., to move the facial interface 2804 away from the display frame 2802). The actuator 3102 can also freely translate in a direction opposite the slide direction 3116 (e.g., to move the facial interface 2804 toward the display frame 2802) when the actuator lock 3104 is disengaged from the actuator 3102. To perform this function, the actuator 3102 can include certain structures. For example, the actuator 302 can include teeth 3106 positioned on a top surface 3107. The teeth 3106 can extend upward from the top surface 3107 for a tooth height 3110. In some examples, the tooth height 3110 can be tuned based on various design factors. For example, the tooth height 3110 can affect a stack thickness of one or more portions of the display frame 2802. As another example, the tooth height 3110 can affect an ability of the actuator lock 3104 to deflect upwards in a direction 3122 (e.g., without damage to the actuator lock 3104). Thus, in some examples, the tooth height 3110 can be minimized or reduced.

As an additional example, the teeth 3106 can include a tooth pitch (e.g., an amount of teeth per inch defining a distance 3112 between teeth) Like the tooth height 3110, the tooth pitch can also be tuned based on various design factors. For example, a finer tooth pitch (e.g., a smaller distance 3112 or more teeth per inch) can be utilized as the tooth height 3110 is decreased. Additionally or alternatively, tooth pitch and/or the tooth height 3110 can be tuned for a desired amount of force at which back-drivability can occur (or to entirely prevent back-drivability according to some examples). In these or other examples, the term "back-drive" or "back-drag" refers to translation of the actuator 3102 in a direction opposite the slide direction 3116 (e.g., when the facial interface 2804 and the display frame 2802 move toward each other in response to an applied force from one of the display frame 2802 or the facial interface 2804).

In more detail, the teeth 3106 can include leading tips 3114. The leading tips 3114 can include a lead-in structure where teeth 3108 (and specifically leading tips 3118) of the actuator lock 3104 can begin to engage. The leading tips 3114, 3118 can include tapered portions or angled portions of the teeth 3106, 3108 that serve as ramps (e.g., to avoid dead-band or teeth misalignment/blunt collisions where the actuator lock 3104 is prevented from engaging the actuator 3102). That is, when transitioning from slider-lock disengagement (shown in FIG. 32) to slider-lock engagement (shown in FIG. 33), the leading tips 3114, 3118 allow the teeth 3108 of the actuator lock to smoothly slide into and seat between the teeth 3106 of the actuator 3102.

With respect to FIG. 32 specifically, the actuator lock 3104 can translate in a lock translation direction 3120 (e.g., perpendicular to the slide direction 3116). In particular, the actuator lock 3104 can translate in the lock translation direction 3120 in response to at least one of the actuator controls 2812a, 2812b being engaged (e.g., depressed) and the flexible drive shafts 2814, 2816 correspondingly engaging the actuator lock 3104. Thereafter, the actuator 3102 can be adjusted to translate the facial interface 2804 toward or away from the display frame 2802 (or associated display). Additionally, upon release of the actuator controls 2812a, 2812b, the actuator lock 3104 can move to an engaged position (shown in FIG. 33) in which the teeth 3106 and the teeth 3108 are engaged or otherwise positioned adjacent each other. In this position, the actuator 3102 is positionally locked in place to inhibit translation of the facial interface 2804 toward or away from the display frame 2802 (or associated display). As further shown in FIG. 33, the leading tips 3114 can extend beyond the teeth 3108, and the leading tips 3118 can extend beyond the teeth 3106.

When the teeth 3106, 3108 are engaged (as shown in FIG. 33), the actuator lock 3104 can be deflected upward in a lock deflection direction 3122. The lock deflection direction 3122 can be perpendicular to both the slide direction 3116 and the lock translation direction 3120. In these or other examples, the actuator lock 3104 can deflect in the lock deflection direction 3122 during a back-driving or back-dragging event in which the actuator 3102 moves opposite the slide direction 3116. To facilitate this back-driving or back-dragging, the actuator lock 3104 can act as a cantilever spring to deflect in the lock deflection direction 3122 in response to an applied force at the facial interface 2804 or the display frame 2802. In some examples, actuator lock 3104 can be tuned to deflect in response to a predetermined amount of force (e.g., about 5 Newtons to about 500 Newtons per actuator, about 10 Newtons to about 100 Newtons per actuator, or about 20 Newtons to about 40 Newtons per actuator). In these or other examples, various design factors for the actuator lock 3104, such as tooth angles or bending stiffness, can be adjusted to provide the desired force tuning.

Any of the features, components, and/or parts, including the arrangements and configurations thereof shown in FIGS. 31-33 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIGS. 31-33. The following description provides more detail regarding an example implementation of multiple linear adjustment connections connected to a flexible driveshaft (or multiple flexible drive shafts).

Figure 34:
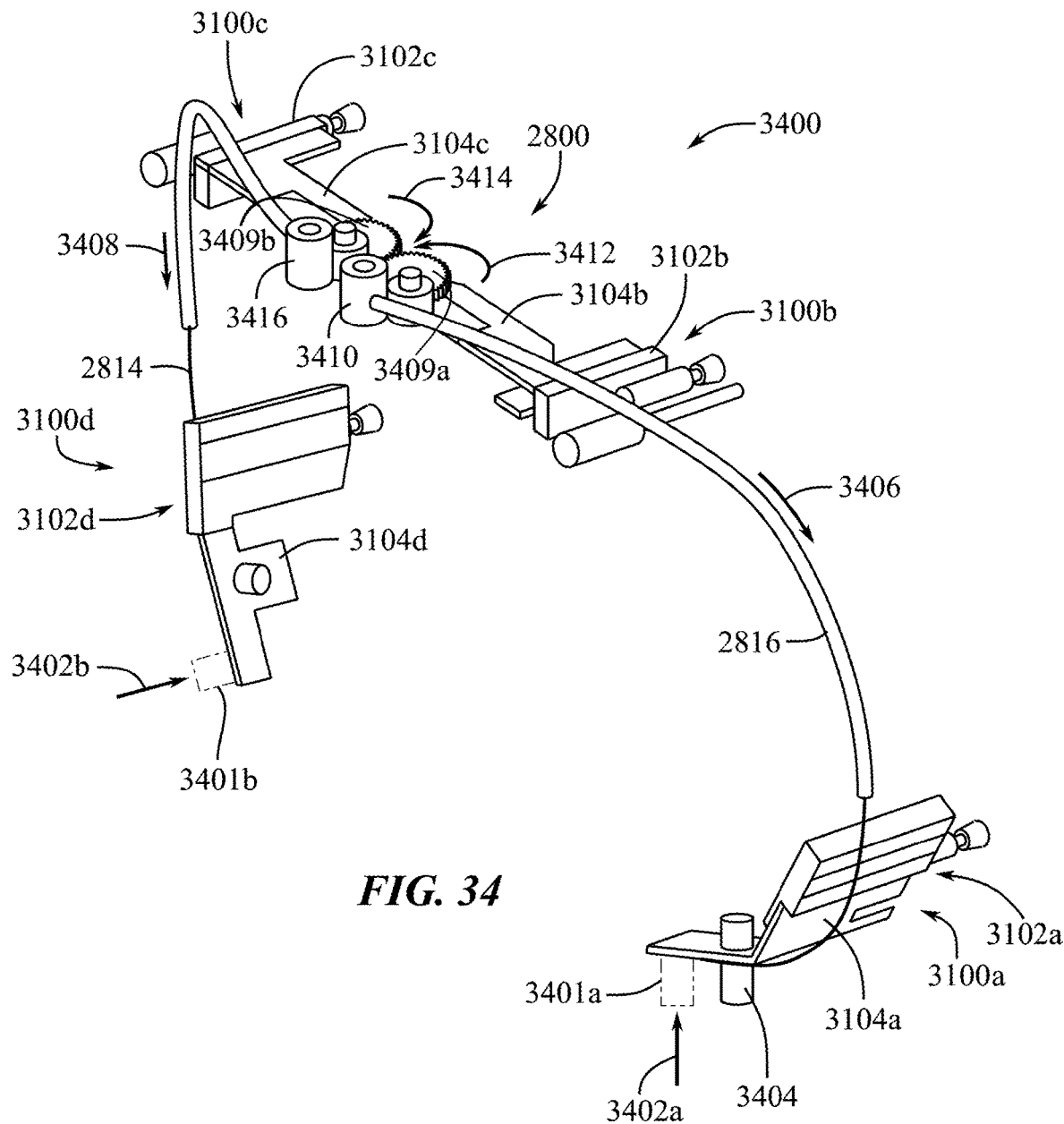
FIG. 34 illustrates a perspective view of a portion of a head-mountable device having multiple linear adjustment connections, according to one exemplary embodiment.

FIG. 34 illustrates a perspective view of a portion of a head-mountable device 3400 in accordance with one or more examples of the present disclosure. As shown, the head-mountable device 3400 includes multiple actuators (e.g., multiple linear adjustment connections 3100a-3100d) discussed above with respect to the linear adjustment connection 3100. As also mentioned, each linear adjustment connection 3100a-3100d can be actuated via the flexible drive shafts 2814, 2816. The flexible drive shafts 2814, 2816 can be motion-synchronized via the linkage 2818 to mitigate (or prevent) uneven translation between each linear adjustment connection 3100a-3100d. Further, in some examples, the linkage 2818 can allow a single input (e.g., a single button press) to actuate each of the linear adjustment connections 3100a-3100d. The following description of FIG. 34 gives an example implementation in which this can be performed.

As shown in FIG. 34, the head-mountable device 3400 can include actuator controls 3401a, 3401b (which can be the same as or similar to the actuator controls 2812a, 2812b discussed above). In response to a force 3402a applied to the actuator control 3401a, the lock 3104a can correspondingly deflect, translate, or otherwise move to release the slide 3102a of the linear adjustment connection 3100a. In addition, the flexible drive shaft 2816 can be attached to a joint 3404 (e.g., a ball joint) connected to the lock 3104a. As the lock 3104a deflects, translates, or otherwise moves in response to the applied force 3402a, the flexible drive shaft 2816 can be tensioned or pulled in a direction 3406.

The flexible drive shaft 2816 can be attached to a gear anchor 3410 such that, upon pulling of the flexible drive shaft 2816 in the direction 3406, a first gear 3409a connected to the gear anchor 3410 rotates in a direction 3412. In turn, the lock 3104b (which is movably attached to the first gear 3409) is pulled back away from the slide 3102b of the linear adjustment connection 3100b as the first gear 3409 rotates in the direction 3412.

Furthermore, rotation of the first gear 3409a in the direction 3412 can simultaneously induce rotation of the second gear 3409b in a direction 3414. The rotation of the second gear 3409b in the direction 3414 can cause the lock 3104c (which is movably attached to the second gear 3409b) to pull back away from the slide 3102c of the linear adjustment connection 3100c.

In addition, rotation of the second gear 3409b in the direction 3414 can cause a gear anchor 3416 connected to the second gear 3409b to push the flexible drive shaft 2814. Specifically, the flexible drive shaft 2814 can be connected to the gear anchor 3416 such that, upon rotation of the second gear 3409b in the direction 3414, the flexible drive shaft 2814 is pushed in a direction 3408. Pushing of the flexible drive shaft 2814 can cause the lock 3104d to release from the slide 3102d of the linear adjustment connection 3100d. For instance, the flexible drive shaft 2814 can be connected to the lock 3104d in a same or similar manner as the flexible drive shaft 2816 is attached to the lock 3104a to impart slide-lock disengagement.

Additionally or alternatively, it will be appreciated that a force 3402b can be applied to the actuator control 3401b, which is in mechanical communication with the lock 3104d (in a same or similar manner as the actuator control 3401a is mechanically coupled to the lock 3104a). Thus, dual inputs via both of the actuator controls 3401a, 3401b can be applied, but are not required, for synchronized actuation of each of the linear adjustment connections 3100a-3100d. Alternatively, the applied force 3402b alone (i.e., without the applied force 3402a) can be used to actuate each of the linear adjustment connections 3100a-3100d.

Further, in some examples, additional or alternative modes of actuating the linear adjustment connections 3100a-3100d can be implemented. For example, solenoids or small motors can be utilized to actuate linear adjustment connections 3100a-3100d (with or without the flexible drive shafts 2814, 2816). Similarly, in some examples, the actuator controls 3401a, 3401b can include alternative types of actuator controls. For example, the actuator controls 3401a, 3401b can be arch sliders that move in an arc path (e.g., along a display frame not shown of the head-mountable display 3400). The arch sliders can be connected to the flexible drive shafts 2814, 2816 as discussed above to actuate the linear adjustment connections 3100a-3100d.

Any of the features, components, and/or parts, including the arrangements and configurations thereof shown in FIG. 34 can be included, either alone or in any combination, in any of the other examples of devices, features, components, and parts shown in the other figures described herein. Likewise, any of the features, components, and/or parts, including the arrangements and configurations thereof shown and described with reference to the other figures can be included, either alone or in any combination, in the example of the devices, features, components, and parts shown in FIG. 34.

In some examples, a personally customized experience can be provided if the systems and methods detailed herein capture, store, access, and/or transmit personal information data. While the present systems and methods can be performed without such personal information data, if personal information data is used, it should be used in accordance with well accepted and established procedures and protocols that are expressly intended to protect the personal information data from unauthorized access or use. In some instances, the personal information data can be anonymized to further protect the data.

The foregoing description used specific nomenclature to provide a thorough understanding and explanation of the described embodiments. However, the specific details are not required in order to practice or perform the described examples. Rather, the foregoing descriptions of the specific examples described herein are provided for illustration and description, and are not intended to be exhaustive or to limit the embodiments to the precise forms disclosed. Furthermore, many modifications and variations are possible in view of the above teachings.

What is claimed is:

1. A wearable apparatus, comprising:
   a head-mountable display, the head-mountable display comprising a frame including:
      an outer surface configured to be oriented toward an ambient environment; and
      an inner surface configured to be oriented toward a face;
   a facial interface coupled to the frame and extending from the inner surface;
   a connection movably constraining the head-mountable display relative to the facial interface in at least two degrees of freedom, the connection positioned between the inner surface and the outer surface; and
   a motor mechanically interfaced with the connection.

2. The wearable apparatus of claim 1, wherein the connection comprises a depth adjustment mechanism that slidably joins the head-mountable display and the facial interface along a first degree of freedom.

3. The wearable apparatus of claim 2, wherein the connection comprises an angular adjustment mechanism that rotatably joins the head-mountable display and the facial interface along a second degree of freedom.

4. The wearable apparatus of claim 1, wherein the connection comprises a manual actuator control.

5. The wearable apparatus of claim 1, wherein the connection comprises a stepped interface.

6. The wearable apparatus of claim 1, wherein the connection comprises a continuous interface with a continuous adjustment resolution.

7. A head-mountable device, comprising:
   a display frame;
   a display disposed within the display frame;
   a facial interface;
   a strap connected to the head-mountable device; and
   an actuator movably constraining the display relative to the facial interface, the actuator comprising a movable connector positioned between inner and outer surfaces of the head-mountable device;
   wherein the actuator is coupled directly to the display and the facial interface.

8. The head-mountable device of claim 7, wherein the actuator comprises a manual actuator control.

9. The head-mountable device of claim 8, wherein the manual actuator control is positioned at a top portion or a side portion of the display frame or the facial interface.

10. The head-mountable device of claim 8, wherein the manual actuator control is positioned on an outer surface of the display frame or the facial interface.

11. The head-mountable device of claim 7, further comprising a sensor connected to the actuator.

12. The head-mountable device of claim 7, wherein the display frame is adjustable within two degrees of freedom relative to the facial interface.

13. The head-mountable device of claim 12, wherein:
   a first degree of freedom comprises a linear translation; and
   a second degree of freedom comprises an angular tilt.

14. A wearable apparatus, comprising:
   a head-mountable display;
   a facial interface;
   a connection movably constraining the head-mountable display relative to the facial interface in a first degree of freedom comprising linear translation and a second degree of freedom comprising angular tilt; and
   an actuator control positionable adjacent to a maxilla region of a human face when the wearable apparatus is donned.

15. The wearable apparatus of claim 14, wherein the connection comprises a linear slide.

16. The wearable apparatus of claim 15, wherein the linear slide is back-drivable.

17. The wearable apparatus of claim 15, further comprising a lock engageable with the linear slide.

18. The wearable apparatus of claim 17, wherein:
the linear slide comprises a first set of teeth; and
the lock comprises a second set of teeth engageable with the first set of teeth.

19. The wearable apparatus of claim 18, wherein the first set of teeth and the second set of teeth each comprise leading tips.

20. The wearable apparatus of claim 19, wherein when the first set of teeth and the second set of teeth are engaged:
the leading tips of the second set of teeth protrude past the first set of teeth; and
the leading tips of the first set of teeth protrude past the second set of teeth.

21. The wearable apparatus of claim 17, wherein the actuator control is configured to engage and disengage the lock and the linear slide.

22. The wearable apparatus of claim 21, wherein the actuator control is connected to the lock via a flexible drive shaft.

23. A head-mountable device, comprising:
a display frame;
a display disposed within the display frame;
a facial interface;
an arm connected to the display frame; and
a linear slide movably constraining the display relative to the facial interface, the linear slide comprising a lock;
wherein:
the arm is connected to the display frame via a pivot connection; and
the display frame is rotatable about the pivot connection independent of the arm.

24. The head-mountable device of claim 23, wherein the lock is deflectable in a first direction.

25. The head-mountable device of claim 24, wherein the lock is translatable in a second direction perpendicular to the first direction.

26. The head-mountable device of claim 25, wherein the linear slide is translatable in a third direction perpendicular to the first direction and the second direction.

* * * * *